United States Patent
Tanigawa et al.

(10) Patent No.: US 10,447,156 B2
(45) Date of Patent: Oct. 15, 2019

(54) IN-VEHICLE POWER SUPPLY DEVICE AND VEHICLE MOUNTED WITH SAME

(71) Applicant: Panasonic Intellectual Property Management Co., Ltd., Osaka (JP)

(72) Inventors: Yasutaka Tanigawa, Mie (JP); Shinichi Yamanouchi, Mie (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 16/038,455

(22) Filed: Jul. 18, 2018

(65) Prior Publication Data

US 2018/0323711 A1    Nov. 8, 2018

Related U.S. Application Data

(62) Division of application No. 15/321,733, filed as application No. PCT/JP2015/003647 on Jul. 21, 2015, now Pat. No. 10,056,829.

(30) Foreign Application Priority Data

Aug. 7, 2014  (JP) .................................. 2014-161112
Aug. 20, 2014 (JP) .................................. 2014-167105
(Continued)

(51) Int. Cl.
*B60Q 9/00*     (2006.01)
*H02M 3/156*   (2006.01)
(Continued)

(52) U.S. Cl.
CPC .............. *H02M 3/156* (2013.01); *B60Q 9/00* (2013.01); *B60R 16/02* (2013.01); *B60R 16/03* (2013.01);
(Continued)

(58) Field of Classification Search
CPC ........ H02M 3/156; H02M 3/155; H02M 1/08; H03K 17/00; B60Q 9/00; B60R 16/02;
(Continued)

(56) References Cited

U.S. PATENT DOCUMENTS 3,239,777 A * 3/1966 Mollo ..................... H02M 1/40
                                                         331/112
3,869,660 A * 3/1975 Davis ..................... H02M 3/156
                                                         323/222
(Continued)

FOREIGN PATENT DOCUMENTS

JP   2004-327783 A   11/2004
JP   2008-182872 A    8/2008
(Continued)

OTHER PUBLICATIONS

International Search Report of PCT Application No. PCT/JP2015/003647 dated Oct. 20, 2015.

*Primary Examiner* — John D Walters
(74) *Attorney, Agent, or Firm* — McDermott Will & Emery LLP

(57) ABSTRACT

A power supply device includes a boost convertor configured to perform a boost-up operation to boost a voltage supplied from an input terminal, a connection-assist diode connected in parallel to the boost convertor between the input terminal and an output terminal, and a switching element connected in parallel to the boost convertor and the connection-assist diode between the input terminal and the output terminal. A controller instructs the switching element to open and instructs the boost convertor to perform a boost-up operation for boosting the voltage at the input terminal during a boost-up period. The controller instructs the boost convertor to stop the boost-up operation when the boost-up period elapses. The controller then instructs the switching element to close the switching element. The (Continued)

controller then determines a state of the switching element based on a voltage at the output terminal detected. The in-vehicle power supply device can stably and accurately determine whether the switching element operates normally or not.

13 Claims, 8 Drawing Sheets

(30) Foreign Application Priority Data

| Aug. 20, 2014 | (JP) | 2014-167106 |
|---|---|---|
| Aug. 20, 2014 | (JP) | 2014-167108 |
| Aug. 20, 2014 | (JP) | 2014-167109 |
| Aug. 20, 2014 | (JP) | 2014-167110 |
| Aug. 20, 2014 | (JP) | 2014-167111 |

(51) Int. Cl.
*B60R 16/02* (2006.01)
*H02M 3/155* (2006.01)
*H03K 17/00* (2006.01)
*B60R 16/033* (2006.01)
*E05B 79/00* (2014.01)
*E05B 81/56* (2014.01)
*E05B 81/74* (2014.01)
*H02M 1/08* (2006.01)
*B60R 16/03* (2006.01)

(52) U.S. Cl.
CPC ............ *B60R 16/033* (2013.01); *E05B 79/00* (2013.01); *E05B 81/56* (2013.01); *E05B 81/74* (2013.01); *H02M 1/08* (2013.01); *H02M 3/155* (2013.01); *H03K 17/00* (2013.01)

(58) Field of Classification Search
CPC ....... B60R 16/03; B60R 16/033; E05B 79/00; E05B 81/56; E05B 81/74
USPC .............. 180/68.5; 123/179.4; 701/112, 102
See application file for complete search history.

(56) References Cited

U.S. PATENT DOCUMENTS

| 5,367,247 | A * | 11/1994 | Blocher | G05F 1/38 323/222 |
|---|---|---|---|---|
| 5,929,620 | A * | 7/1999 | Dobkin | G05F 1/565 323/285 |
| 9,197,086 | B2 | 11/2015 | Zhou et al. | |
| 9,651,959 | B2 * | 5/2017 | Chen | G05F 1/56 |
| 9,744,876 | B2 * | 8/2017 | Sato | B60L 11/1872 |
| 9,774,265 | B2 * | 9/2017 | Pasqua | H02M 3/33515 |
| 9,798,367 | B2 * | 10/2017 | Huang | G06F 1/26 |
| 9,812,972 | B2 * | 11/2017 | Tumminaro | H02M 1/36 |
| 9,835,689 | B2 * | 12/2017 | Osanai | G01R 31/40 |
| 2008/0150483 | A1 | 6/2008 | Morita et al. | |
| 2010/0133024 | A1 * | 6/2010 | Miwa | B60K 6/365 180/65.21 |
| 2010/0224157 | A1 * | 9/2010 | Mizuno | G01R 31/3828 123/179.4 |
| 2011/0019446 | A1 * | 1/2011 | Wu | H02M 3/33523 363/79 |
| 2011/0075314 | A1 * | 3/2011 | Bauer | F02D 41/20 361/152 |
| 2011/0080143 | A1 * | 4/2011 | Parakulam | H02M 3/1582 320/162 |
| 2011/0089349 | A1 * | 4/2011 | Walter | F16K 31/0675 251/129.05 |
| 2011/0089917 | A1 * | 4/2011 | Chen | H02M 3/1584 323/282 |
| 2011/0213520 | A1 * | 9/2011 | Yaguchi | B60L 58/12 701/22 |
| 2013/0077354 | A1 * | 3/2013 | Behagel | H02M 3/33523 363/21.01 |
| 2013/0100714 | A1 * | 4/2013 | Zhang | H02M 3/33507 363/21.17 |
| 2013/0121040 | A1 * | 5/2013 | Lund | H02M 3/33523 363/21.17 |
| 2013/0223107 | A1 * | 8/2013 | Zhang | H02M 3/33523 363/21.16 |
| 2013/0250327 | A1 | 9/2013 | Saitoh | |
| 2013/0250627 | A1 * | 9/2013 | Herfurth | H02M 3/3376 363/21.15 |
| 2014/0070784 | A1 * | 3/2014 | Lynch | H02M 3/156 323/283 |
| 2014/0160809 | A1 * | 6/2014 | Lin | H02M 3/33523 363/21.16 |
| 2014/0222294 | A1 * | 8/2014 | Sugiyama | B62D 5/046 701/42 |
| 2015/0008742 | A1 * | 1/2015 | Huang | H02M 3/158 307/31 |
| 2015/0318777 | A1 * | 11/2015 | Pasqua | H02M 1/36 363/21.13 |
| 2017/0047849 | A1 * | 2/2017 | Malinin | H02M 1/36 |
| 2017/0179845 | A1 * | 6/2017 | Adragna | H02M 1/4225 |
| 2017/0225636 | A1 * | 8/2017 | Tanigawa | B60Q 9/00 |

FOREIGN PATENT DOCUMENTS

| JP | 2011-223755 A | 11/2011 |
|---|---|---|
| JP | 2012-065494 A | 3/2012 |

* cited by examiner

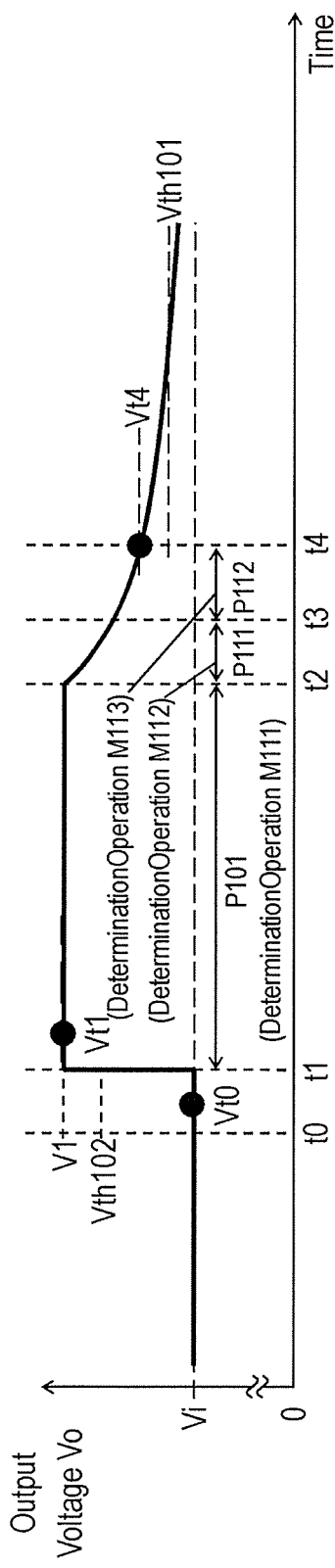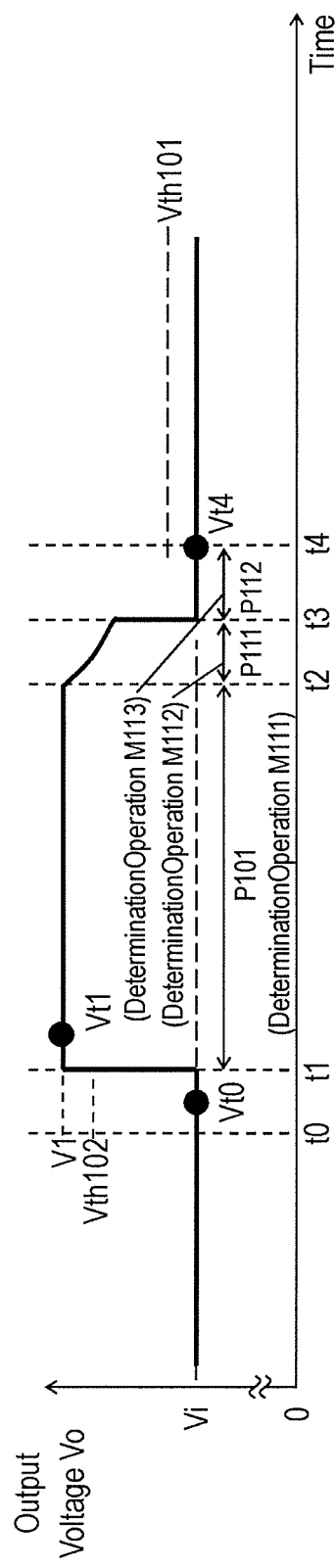

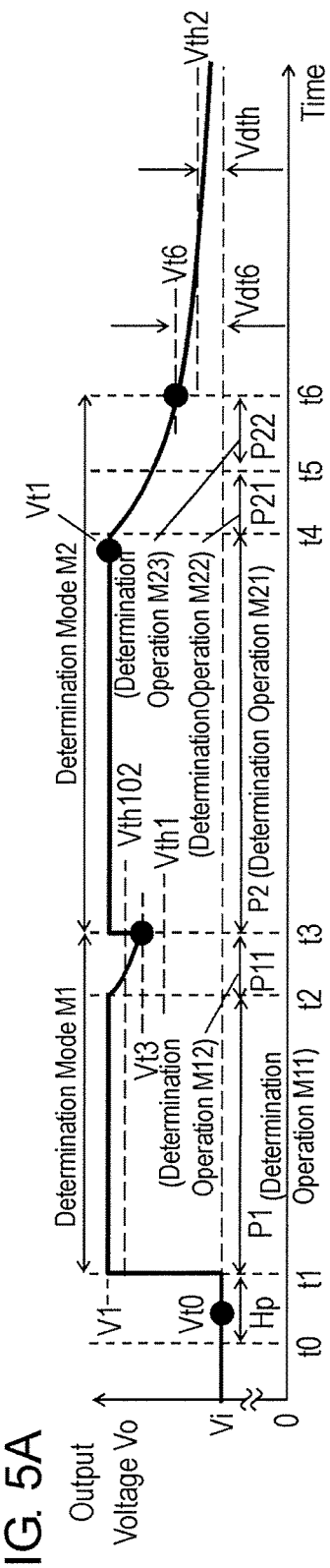
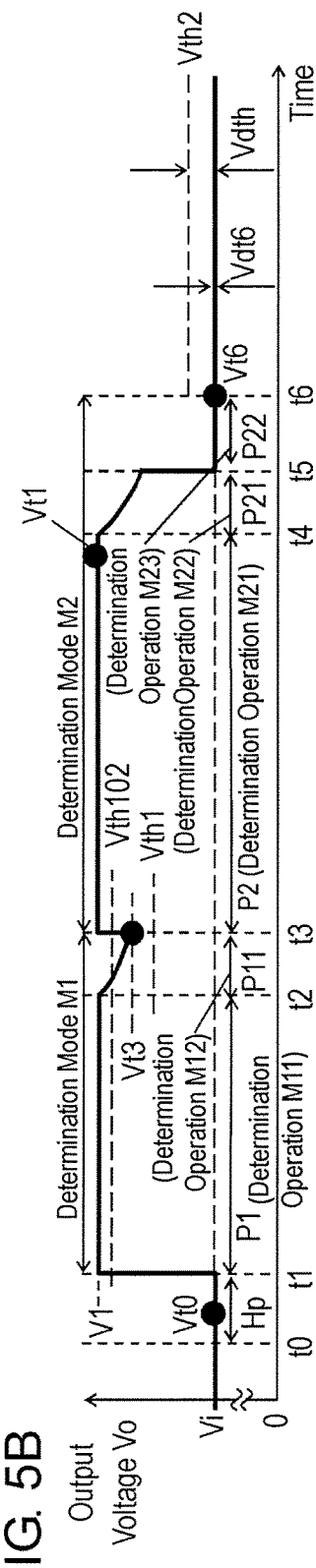
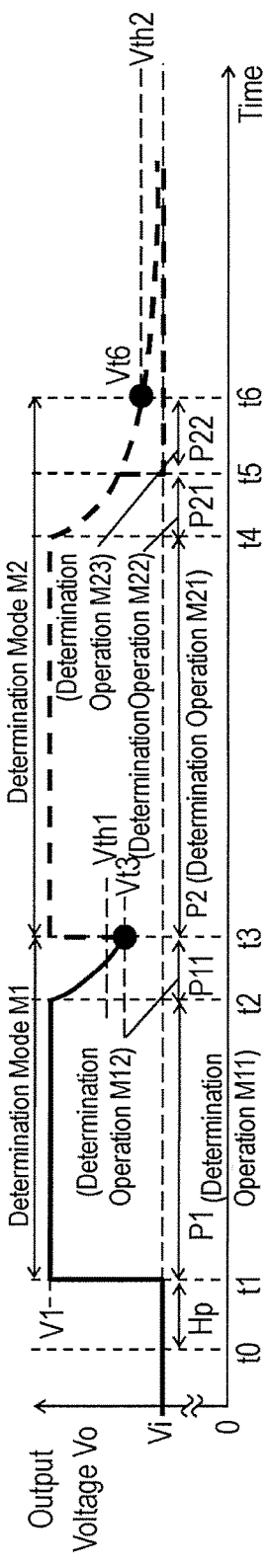
FIG. 5A
FIG. 5B
FIG. 5C

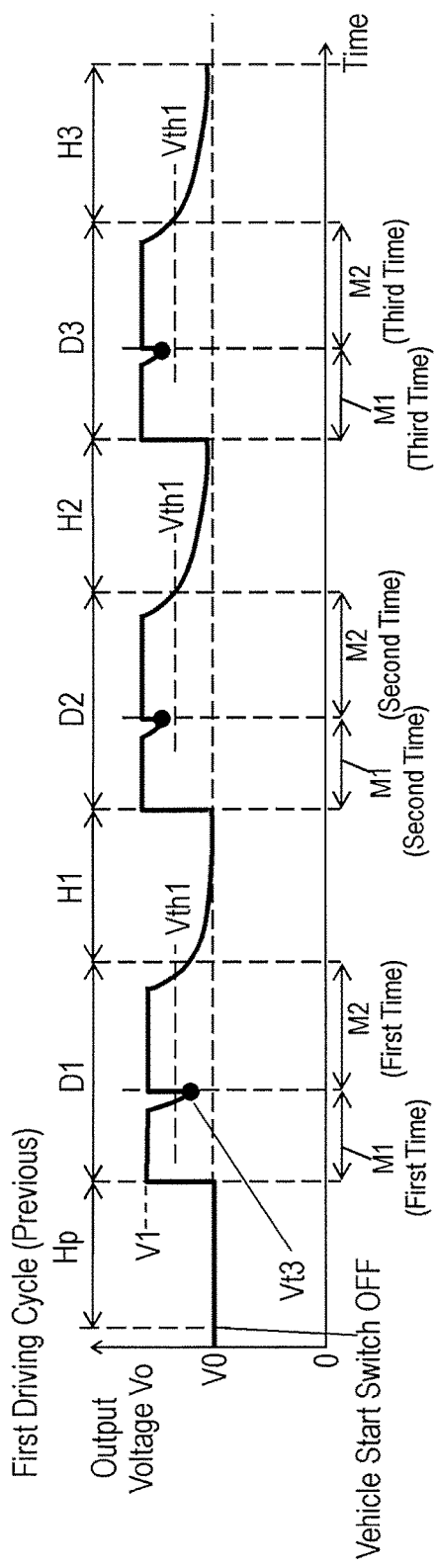
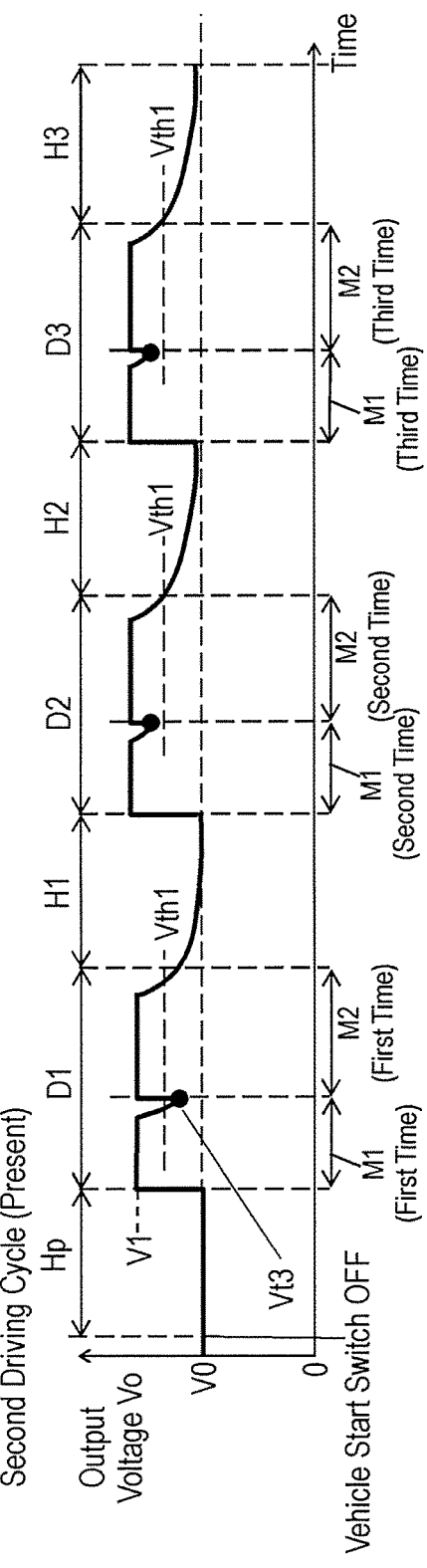

IN-VEHICLE POWER SUPPLY DEVICE AND VEHICLE MOUNTED WITH SAME

CROSS REFERENCE TO RELATED APPLICATIONS

This Application is a Divisional of U.S. patent application Ser. No. 15/321,733 filed Dec. 22, 2016, which is a National Stage Entry of International Application No. PCT/JP2015/003647 filed Jul. 21, 2015, which claims priority to Japanese Patent Application Nos. 2014-161112 filed Aug. 7, 2014, 2014-167105, 2014-167106, 2014-167108, 2014-167109, 2014-167110 and 2014-167111, all filed Aug. 20, 2014. The entire contents of these applications are incorporated herein by reference in their entirety.

TECHNICAL FIELD

The present invention relates to an in-vehicle power supply device and a vehicle including the device.

BACKGROUND ART

FIG. 8 is a circuit block diagram of a conventional in-vehicle power supply device 500 that has a stop-idling function and is mounted to a vehicle. A positive electrode of storage battery 1 is connected to input terminal 2a of power supply circuit 2 through fuse 3 while output terminal 2b of power supply circuit 2 is connected to load 4. In power supply circuit 2, boost converter 5, connection-assist diode 6, and switch 7 are arranged in parallel, and are connected to input terminal 2a and output terminal 2b. An anode of connection-assist diode 6 is connected to input terminal 2a of power supply circuit 2 while a cathode of connection-assist diode 6 is connected to output terminal 2b of power supply circuit 2.

When a vehicle is restarted from a stop-idling state, boost converter 5 of power supply circuit 2 boosts a voltage of storage battery 1, thereby restarting the vehicle stably. Switch 7 opens only when boost converter 5 performs a boost-up operation. In this operation, control unit 8 mounted to the vehicle controls boost converter 5 and switch 7. Further, in order not to supply the boosted voltage to input terminal 2a while boost converter 5 performs the boost-up operation, connection-assist diode 6 of power supply circuit 2 is provided. Besides, in order to supply electric power to load 4 from storage battery 1 even if switch 7 is damaged for some reason to continuously open, connection-assist diode 6 is provided.

That is, storage battery 1 can supply electric power to load 4 as long as either connection-assist diode 6 or switch 7 is in a normal state.

In the case that connection-assist diode 6 and switch 7 both open, electric power is supplied to boost converter 5 from storage battery 1 continuously, so that boost converter 5 may be damaged. To prevent this, control unit 8 detects a voltage at output terminal 2b of power supply circuit 2. Control unit 8 constantly monitors whether switch 7 opens or is closed in response to an instruction from control unit 8.

As for the monitoring method, firstly, control unit 8 previously detects a voltage at output terminal 2b of power supply circuit 2 while switch 7 is securely closed, and then stores the detected voltage.

If electric power is supplied to output terminal 2b of power supply circuit 2 from storage battery 1 through connection-assist diode 6 in the case that switch 7 fails to be closed in response to an instruction of control unit 8, a voltage drops due to connection-assist diode 6. For this reason, the voltage at output terminal 2b output through connection-assist diode 6 has a lower value than the voltage stored previously. Control unit 8 monitors a state of switch 7 based on the difference between these voltage values.

When determining that switch 7 has abnormality, control unit 8 sends this situation to the outside immediately, and thus boost converter 5 is intentionally avoided from being damaged.

A control unit similar to the above-mentioned device is disclosed in, e.g. PTL 1.

CITATION LIST

Patent Literature

PTL 1: Japanese Laid-Open Patent Publication No. 2004-327783

SUMMARY

A power supply device includes a boost convertor configured to perform a boost-up operation to boost a voltage supplied from an input terminal, a connection-assist diode connected in parallel to the boost convertor between the input terminal and an output terminal, and a switching element connected in parallel to the boost convertor and the connection-assist diode between the input terminal and the output terminal. A controller instructs the switching element to open and instructs the boost convertor to perform a boost-up operation for boosting the voltage at the input terminal during a boost-up period. The controller instructs the boost convertor to stop the boost-up operation when the boost-up period elapses. The controller then instructs the switching element to close the switching element. The controller then determines a state of the switching element based on a voltage at the output terminal detected.

The in-vehicle power supply device can stably and accurately determine whether the switching element operates normally or not.

BRIEF DESCRIPTION OF DRAWINGS

FIG. 3A shows an output voltage of the in-vehicle power supply device in accordance with Embodiment 1.

FIG. 3B shows the output voltage of the in-vehicle power supply device in accordance with Embodiment 1.

FIG. 5A shows an output voltage of the in-vehicle power supply device in accordance with Embodiment 2.

FIG. 5B shows the output voltage of the in-vehicle power supply device in accordance with Embodiment 2.

FIG. 5C shows the output voltage of the in-vehicle power supply device in accordance with Embodiment 2.

FIG. 7A shows the output voltage of the in-vehicle power supply device in accordance with Embodiment 2.

FIG. 7B shows the output voltage of the in-vehicle power supply device in accordance with Embodiment 2.

DETAIL DESCRIPTION OF PREFERRED EMBODIMENTS

Exemplary Embodiment 1

Figure 1:
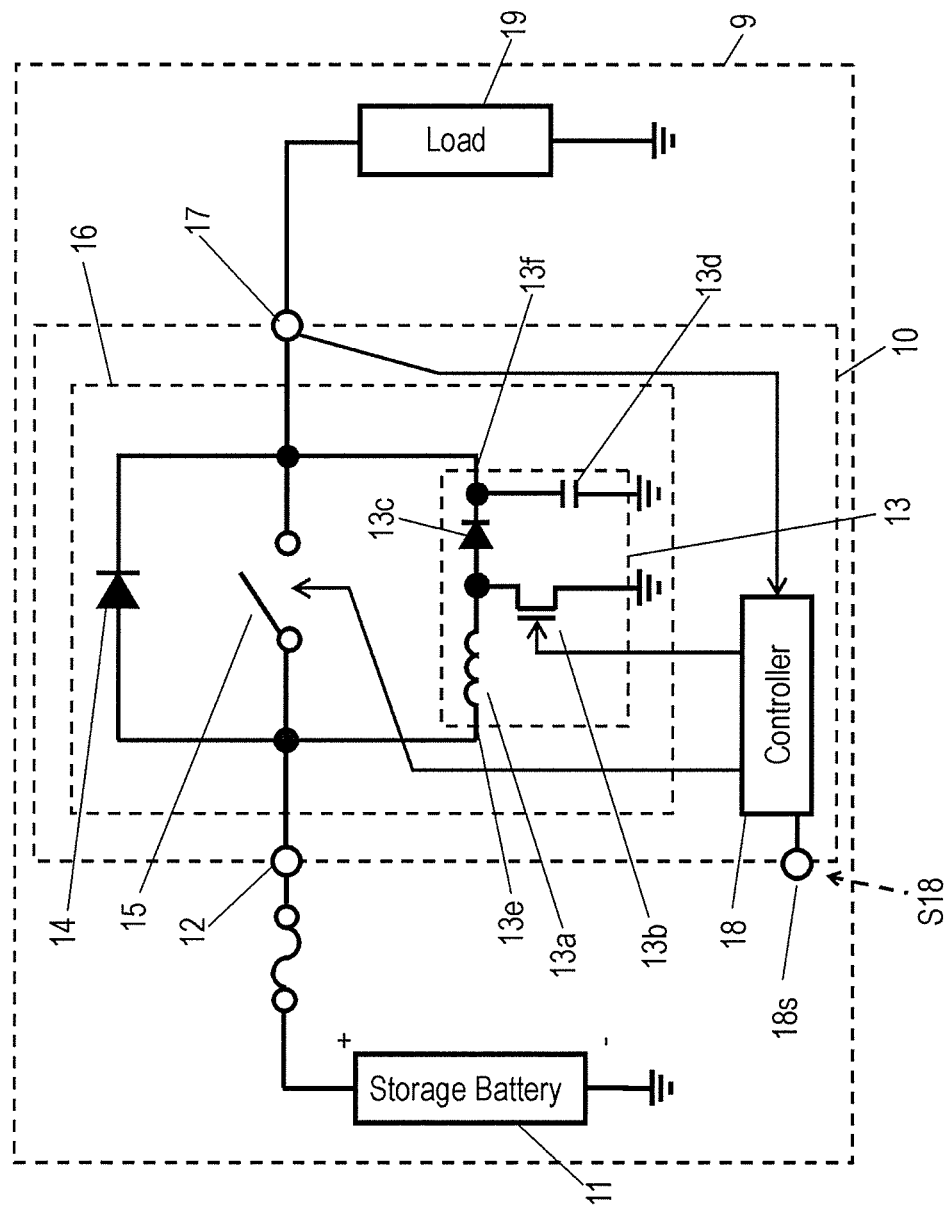
FIG. 1 is a circuit block diagram of an in-vehicle power supply device in accordance with Exemplary Embodiment 1.
Figure 2:
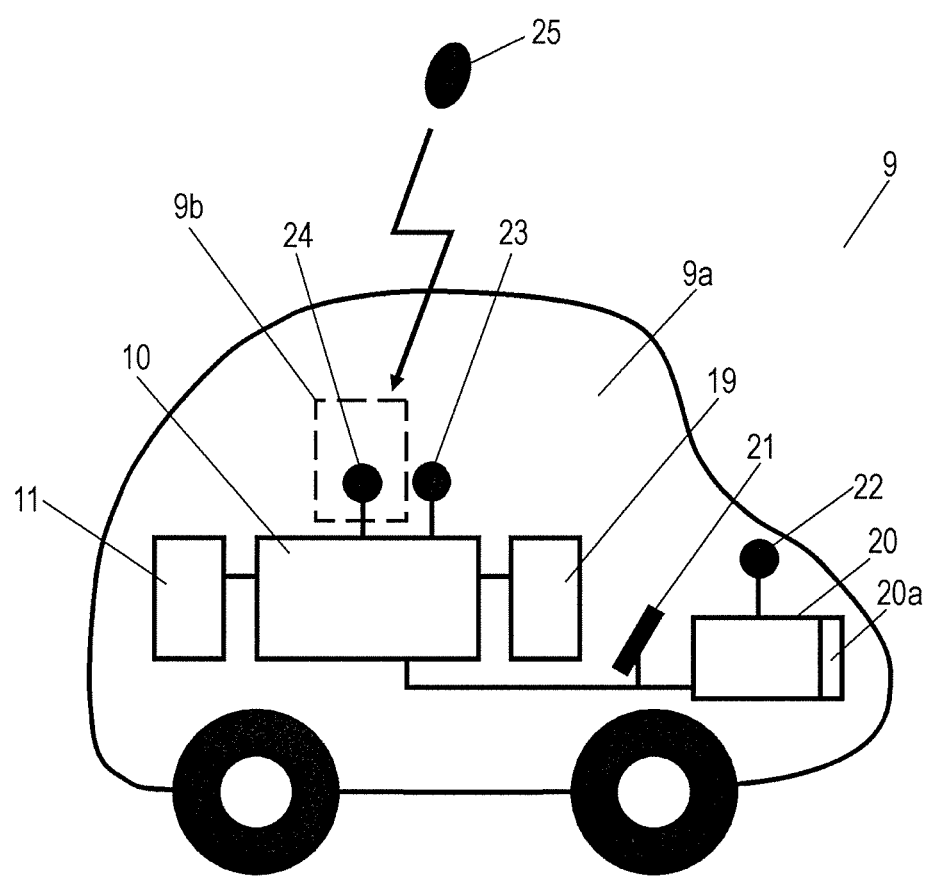
FIG. 2 is a schematic diagram of a vehicle equipped with the in-vehicle power supply device in accordance with Embodiment 1.

FIG. 1 is a circuit block diagram of in-vehicle power supply device 10 in accordance with Exemplary Embodiment 1. FIG. 2 is a schematic diagram of vehicle 9 equipped with in-vehicle power supply device 10. Vehicle 9 has a stop-idling function. In-vehicle power supply device 10 includes input terminal 12, power supply circuit 16, output terminal 17 connected to input terminal 12 via power supply circuit 16, controller 18, and start-signal receiving section 18s. Controller 18 detects a voltage at output terminal 17 and controls boost convertor 13 and switching element 15. Controller 18 is connected to start-signal receiving section 18s. Power supply circuit 16 includes boost convertor 13, connection-assist diode 14, and switching element 15 which are connected in parallel to one another. Load 19 is connected to output terminal 17. Boost convertor 13 has input port 13e connected to input terminal 12, and has output port 13f connected to output terminal 17. Boost convertor 13 boosts input voltage Vi input to input port 13e, i.e., input terminal 12, and outputs output voltage Vo, the boosted voltage, from output port 13f, i.e., output terminal 17.

FIGS. 3A and 3B illustrate output voltage Vo when in-vehicle power supply device 10 operates. In FIGS. 3A and 3B, a vertical axis represents output voltage Vo, and a horizontal axis represents time. Power supply circuit 16 has first determining operation M111, second determining operation M112, and third determining operation M113. In first determining operation M111, controller 18 instructs switching element 15 to open switching element 15 in response to start signal S18 received by controller 18 through start-signal receiving section 18s. In addition to this, boost convertor 13 performs a boost-up operation in which boost converter 13 boosts up voltage Vi at input terminal 12 to voltage V1 in a boost-up period. In second determining operation M112, controller 18 causes boost convertor 13 to stop the boost-up operation when boost-up period P101 elapses. Then, controller 18 instructs switching element 15 to close and connect switching element 15 when predetermined period P111 further elapses. In third determining operation M113, controller 18 determines a state of switching element 15 according to voltage Vo detected at output terminal 17 when terminating second determining operation M112.

In the above configuration and operation, controller 18 determines whether switching element 15 is in a normal state, i.e., can function in response to instructions of controller 18, or is in an abnormal state, i.e., fails to function in response to the instructions of the controller 18. Controller 18 checks switching element 15 upon receiving start signal S18. Start signal S18 is sent from vehicle 9. The controller determines the state of switching element 15 while current Io supplied to load 19 from output terminal 17 is small.

Controller 18 detects, as voltage Vo at output terminal 17, either a discharge voltage discharged from boost convertor 13 after the boost-up operation or an input voltage Vi from the input terminal 12 appearing at output terminal 17 when switching element 15 is closed to be connected. The discharge voltage which is continuously output through output terminal 17 by boost convertor 13 when switching element 15 is in the abnormal state is drastically different from a voltage equivalent to input voltage Vi, which is obtained through output terminal 17 when switching element 15 is in a normal state.

That is, if current Io flowing through output terminal 17 or load 19 is small enough, a value of detected voltage Vo changes drastically according to the state of switching element 15. Thus, controller 18 determines, based on voltage Vo detected, whether switching element 15 is in a normal state or in an abnormal state. The controller can determines easily and accurately whether switching element 15 operates normally or not.

A configuration and operation of in-vehicle power supply device 10 and vehicle 9 including the device will be detailed below. Vehicle 9 having a stop-idling function includes vehicle body 9a, in-vehicle power supply device 10, storage battery 11, and load 19. In-vehicle power supply device 10, storage battery 11, and load 19 are disposed in vehicle body 9a. Storage battery 11 and load 19 are connected to input terminal 12 and output terminal 17 of in-vehicle power supply device 10, respectively. When engine 20 is restarted from a stop-idling state by starter 20a while vehicle 9 stops for waiting for, a traffic light, in-vehicle power supply device 10 performs a basic operation as follows. For instance, if a driver changes operation conditions of brake pedal 21 in the stop-idling state, in-vehicle power supply device 10 receives a signal for starting in-vehicle power supply device 10. When in-vehicle power supply device 10 starts and causes boost convertor 13 to perform the boost-up operation, starter 20a rotates to restart engine 20. At this moment, a necessary voltage for load 19 is supplied. As a result, load 19 can continuously operate stably. Vehicle 9 further includes door 9b attached to vehicle body 9a, and door lock device 24 provided in door 9b. Door lock device 24 locks and unlocks door 9b, i.e., can release the lock of door 9b.

In power supply circuit 16 of in-vehicle power supply device 10, when engine 20 is in a stop-idling state while vehicle 9 stops while, e.g. waiting for a traffic light, controller 18 closes switching element 15 and prohibits boost convertor 13 from operating. In this situation, storage battery 11 supplies electric power to load 19 through input terminal 12 and switching element 15.

On the other hand, when engine 20 is turned into a restarting state from the stop-idling state, controller 18 opens switching element 15 and starts operating boost convertor 13. In this situation, boost convertor 13 supplies electric power to load 19 during a predetermined period of time.

When engine 20 is turned into a continuous operation state, boost convertor 13 terminates the above operations performed during the predetermined period of time and finishes the supply of electric power to load 19, and then, switching element 15 is closed. Thus, storage battery 11 supplies electric power to load 19 through input terminal 12 and switching element 15. While engine 20 is in the continuous operation state, this situation basically continues. Boost convertor 13 includes boosting coil 13a, field-effect transistor (FET) 13b, rectifier diode 13c, and smoothing capacitor 13d. Smoothing capacitor 13d is connected closest to output terminal 17 of boost convertor 13, i.e., output port 13f.

Even if switching element 15 of power supply circuit 16 fails to function due to, e.g. breakage thereof, connection-assist diode 14 connected in parallel to switching element 15 supplies electric power to load 19 from storage battery 11 continuously although in-vehicle power supply device 10 may not start boost convertor 13. An anode of connection-assist diode 14 is connected to input terminal 12 of in-vehicle power supply device 10 while a cathode thereof is connected to output terminal 17 of in-vehicle power supply device 10.

If switching element 15 fails to function due to, e.g. breakage thereof, controller 18 of in-vehicle power supply device 10 sends, to the outside of in-vehicle power supply device 10, a signal indicating that switching element 15 does not function. Controller 18 of in-vehicle power supply device 10 requires checking and repairing of switching element 15 to the outside of in-vehicle power supply device 10. In-vehicle power supply device 10 checks whether or not switching element 15 can operate normally by the following procedure.

Controller 18 of in-vehicle power supply device 10 may check the state of switching element 15 in various situations of vehicle 9. In accordance with Embodiment 1, controller 18 checks the state of switching element 15 after a driver switches operation switch 22 functioning as a vehicle-starting switch of vehicle 9 from turning on of operation switch 22 to turning off of operation switch 22. This operation will be described below.

The vehicle-starting switch may be an engine switch, an accessory switch, or an ignition switch. Whenever any operation to operation switch 22 is necessary to describe what kind of operation to any of switches is referred, each operation will be described. The engine switch is turned on while engine 9 drives, and turned off when engine 9 stops driving. A stop-idling state is a state where the engine 9 temporarily stops. At this moment, the engine switch is turned on. Further, the accessory switch is turned on when, e.g. a car audio can be used, and is turned off when vehicle 9 completely stops and vehicle 9 is left.

In the following description, the vehicle-starting switch is turned on when at least one of the engine switch, the accessory switch, and the ignition switch is turned on. The vehicle-starting switch is turned off when all of the engine switch, the accessory switch, and the ignition switch are turned off.

Controller 18 preferably checks switching element 15 after operation switch 22 functioning as the engine switch and the accessory switch of vehicle 9 is switched by a driver from turning on of operation switch 22 to turning off of operation switch 22.

As described above, power supply circuit 16 of in-vehicle power supply device 10 has first determining operation M111, second determining operation M112, and third determining operation M113 which are performed by controller 18. FIGS. 3A and 3B illustrate output voltage Vo in first determining operation M111, second determining operation M112, and third determining operation M113. Controller 18 instructs switching element 15 to open or close switching element 15, and instructs boost convertor 13 to perform a boost-up operation. Controller 18 performs calculation based on a value of voltage Vo detected, and stores data of the calculation result. Controller 18 checks the state of switching element 15 based on these data and transmits a signal about the checked result.

In FIGS. 3A and 3B, before time point t0, engine 20 starts up to drive vehicle 9 constantly with fuel. At time point t0, the driver switches operation switch 22 functioning as an engine switch of vehicle 9 from turning on of switch 22 to turning off of switch 22 to stop engine 20. When operation switch 22 is switched from turning on of switch 22 to turning off of switch 22, engine OFF signal S18 is sent to controller 18 from vehicle 9 through start-signal receiving section 18s.

Thus, from time point t0 by time point t1 when first determining operation M111 is started, electric power consumed in load 19 decreases significantly.

When first determining operation M111 is started at time point t1, controller 18 instructs switching element 15 to open switching element 15. In addition to this, at time point t1, controller 18 instructs boost convertor 13 to performs a boost-up operation in which boost converter 13 boosts voltage Vi of storage battery 11 to voltage V1. An output voltage of storage battery 11 applied to input terminal 12 as input voltage Vi is, e.g. 12V. The output voltage is boosted to voltage V1 of 14.5V in boost-up period P101 from time point t1 to time point t2. Boost-up period P101 may be determined appropriately. The period from time point t0 to time point t1 may be determined appropriately. Time point t0 may be identical to time point t1. During boost-up period P101 in first determining operation M111, input voltage Vi of 12V is boosted to voltage V1 of 14.5V. On the other hand, when engine 20 is turned into a restarting state from a stop-idling state while operation switch 22 is turned on, the boost-up operation is performed such that input voltage Vi of 12V is maintained and output from output terminal 17 as output voltage Vo. Thus, in the boost-up operation, output voltage Vo boosted from input voltage Vi may be changed to different values depending on situations.

Next, second determining operation M112 is started at time point t2. In second determining operation M112, controller 18 causes boost convertor 13 to stop the boost-up operation at time point t2 when boost-up period P101 elapses. At time point t3 when predetermined period P111 elapses from time point t2 when boost convertor 13 is stopped, controller 18 instructs switching element 15 to switch from an open state to a closed state.

Subsequently, in third determining operation M113, at time point t4 when predetermined period P112 elapses from time point t3 when controller 18 instructs switching element 15 to be switched from the open state to the closed state, controller 18 detects voltage Vt4 which is a value of output voltage Vo at output terminal 17. Controller 18 checks the state of switching element 15 based on voltage Vt4.

During period P111 from time point t2 to time point t3 for which second determining operation M112 is performed, any of discharge voltage from smoothing capacitor 13d or voltage of storage battery 11 through connection-assist diode 14 whichever is higher is supplied to output terminal 17. During period P111, switching element 15 opens, and boost convertor 13 has already stopped at time point t2, so that the boost-up operation is not performed. Therefore, voltage Vo at output terminal 17 decreases with time elapsing from time point t2 to time point t3. At time point t3 after time point t2, controller 18 instructs switching element 15 to be switched from the open state to the closed state.

Then, if switching element 15 which is in the open state until time point t3 can function in response to an instruction from controller 18, i.e., is in a normal state, voltage Vo of output terminal 17 changes drastically at time point t3, as shown in FIG. 3B, when switching element 15 is closed in the closed state. That is, output terminal 17 is connected through switching element 15 to voltage Vi of storage battery 11 lower than a voltage at output port 13f of the boost convertor 13. Therefore, voltage Vo at the output terminal 17 rapidly decreases to voltage Vi at time point t3.

Since voltage Vo at the output terminal 17 decreases to voltage Vi of 12V as the output voltage of storage battery 11, voltage Vo at the output terminal 17 decreases at time point t4 to be lower than determination value Vth101 which is a predetermined determination value. When voltage Vo at output terminal 17 is thus lower than determination value Vth101 at time point t4, controller 18 determines that switching element 15 is in the normal state.

On the other hand, if switching element 15 which is in the open state until time point t3 fails to operate in response to an instruction from controller 18 i.e., is in an abnormal state, switching element 15 remains to be in the open state after time point t3. Thus, voltage Vo at output terminal 17 decreases gradually and continuously, as shown in FIG. 3A. That is, like during period P211 from time point t2 to time point t3 in second determining operation M112, any of discharge voltage from smoothing capacitor 13d or voltage of the storage battery 11 through connection-assist diode 14 whichever is higher is continuously supplied to output terminal 17 after time point t3. Thus, voltage Vo at output terminal 17 decreases at time point t4 to be a value equal to or higher than predetermined determination value Vth 101. When voltage Vo at output terminal 17 is equal to or higher than determination value Vth101 at time point t4, controller 18 determines that switching element 15 is in the abnormal state. Strictly speaking, controller 18 determines that switching element 15 fails to operate in response to an instruction to be closed, i.e., to be in the open state. When controller 18 determines that switching element 15 is in the abnormal state, controller 18 sends the determination result indicating that switching element 15 is in the abnormal state, to warning device 23 in vehicle 9 as an alarm signal. Warning device 23 is provided outside in-vehicle power supply device 10.

Smoothing capacitor 13d during from time point t2 to time point t4 is discharged after operation switch 22 is switched from the turning on of operation switch 22 to the turning off of operation switch 22. If small load 19 is connected to output terminal 17, current Io supplied to load 19 is small. Therefore, when switching element 15 fails to operate in an instruction from controller 18, i.e., is in the abnormal state, a value of output voltage Vt4 much higher than determination value Vth101 is obtained at time point t4 although the value of output voltage Vt4 is lower than voltage V1 of 14.5V in the boost-up period P101.

For this reason, the value of voltage Vo to be output changes drastically depending on the state of switching element 15. Consequently, in such an abnormal state of switching element 15, controller 18 can easily compare voltage Vt4 of output terminal 17 at time point t4 with determination value Vth101 as mentioned above. That is, controller 18 can easily determine whether or not switching element 15 operates normally accurately.

Since the value of output voltage at time point t4 when switching element 15 is in the abnormal state is greatly different from the value of output voltage Vo at time point t4 when switching element 15 is in the normal state, a range of determination value Vth101 can be set widely.

Accordingly, even if switching element 15 is in a normal state, controller 18 can easily compare voltage Vt4 at output terminal 17 with determination value Vth101 at time point t4.

In the above operation, controller 18 compares voltage Vo at output terminal 17 with determination value Vth101. Besides, controller 18 checks the state of switching element 15 based on the comparison result. However, determination of controller 18 is not limited to the above determination.

As mentioned above, controller 18 is configured to perform first determining operation M111, second determining operation M112, and third determining operation M113. In first determining operation, controller 18 instructs switching element 15 to open switching element 15, and instructs boost convertor 13 to performs a boost-up operation in which boost converter 13 boosts voltage Vi at input terminal 12 in boost-up period P101. In second determining operation M112, controller 18 instructs boost convertor 13 to stop the boost-up operation at time point t2 when boost-up period P101 elapses, and instructs switching element 15 to close switching element 15 at time point t3 when predetermined period P111 elapses from time point t2. In third determining operation M113, controller 18 checks the state of switching element 15 based on voltage Vo detected at output terminal 17 after terminating second determining operation M112.

When determining that switching element 15 is in the abnormal state in third determining operation M113, controller 18 may store the determination result in third determining operation M113. When operation switch 22 is switched to restart vehicle 9 after the determination result is stored, controller 18 may be configured to send an alarm signal to warning device 23. At this moment, operation switch 22 may be a vehicle-starting switch for starting vehicle 9.

In-vehicle power supply device 10 may check switching element 15 when first determining operation M111 is started after the driver switches operation switch 22 functioning as an accessory switch of vehicle 9 from turning on of switch 22 to turning off of switch 22.

When operation switch 22 functioning as the accessory switch is switched from turning on to turning off, current Io supplied to load 19 decreases further to be smaller than the current when the engine switch is switched from turning on to turning off. That is, when switching operation switch 22 functioning as the accessory switch is switched from turning on to turning off, load 19, such as a car audio, is considered to be removed. That is, output voltage Vo is discharged gradually after time point t2 and draws an attenuation curve with a very slow rate. Accordingly, if switching element 15 is in an abnormal state during third determining operation M113, voltage Vt4 maintains to be a high voltage value.

Thus, the value of output voltage Vo changes largely depending on the state of switching element 15. Therefore, when switching element is in an abnormal state as mentioned above, controller 18 can easily compare voltage Vt4 at output terminal 17 with determination value Vth101 at time point t4. That is, controller 18 can easily and accurately determine whether or not switching element 15 operates normally.

Since the value of output voltage Vt4 at time point t4 when switching element 15 is in the abnormal state is largely different from the value of output voltage Vt4 at time point t4 when switching element 15 is in the normal state, a range of determination value Vth101 can also be set widely. Accordingly, even if switching element 15 is in a normal state, controller 18 can easily compare voltage Vt4 of output terminal 17 with determination value Vth101 at time point t4.

Herein, a certain value is determined to be determination value Vth101, and the determination value is compared with voltage Vo of output terminal 17. Controller 18 checks the state of switching element 15 based on the comparison result. However, determination of controller 18 is not limited to the above configuration.

In first determining operation M113, controller 18 instructs switching element 15 to open switching element 15 in response to power source start signal S18 received by controller 18 while controller 18 is in a sleep state. That is, first determining operation M113 is performed in response to power source start signal S18 received by controller 18 while controller is in the sleep state. In addition to this, boost convertor 13 performs a boost-up operation to boost voltage Vi of input terminal 12 to voltage V1 in boost-up period P101. In second determining operation M112, controller 18 causes boost convertor 13 to stop the boost-up operation after boost-up period P101 elapses, and then, instructs switching element 15 to close switching element 15 after predetermined period P111 elapses. In third determining operation M113, controller 18 checks the state of switching element 15 based on voltage Vo of output terminal 17 detected after terminating second determining operation M112.

In the above configuration and operation, it is determined whether switching element 15 functions in response to an instruction of controller 18, i.e., is in a normal state, or fails to function in response to an instruction of controller 18, i.e., is in an abnormal condition. The determination is performed in response to power source start signal S18 received by controller 18 while being in the sleep state. While in-vehicle power supply device 10 and controller 18 are in the sleep state, if load 19 is very small and equivalent to no load, controller 18 receives power source start signal S18 from the outside of power supply circuit 16. That is, while current Io supplied to load 19 from output terminal 17 is very small, the state of switching element 15 is checked.

Either discharge voltage discharged from boost convertor 13 after the boost-up operation or input voltage Vi from input terminal 12 is detected by controller 18 as output voltage Vo. Input voltage Vi appears at output terminal 17 when switching element 15 is closed. The discharge voltage which is continuously output through output terminal 17 by boost convertor 13 when switching element 15 is in an abnormal state is largely different from a voltage equivalent to input voltage Vi obtained through output terminal 17 when switching element 15 is in a normal state.

That is, if current Io flowing through output terminal 17 and load 19 is very small, a value of voltage Vo detected here largely changes depending on the state of switching element 15. Thus, controller 18 determines whether switching element 15 is in a normal state or in an abnormal state based on voltage Vo detected. Accordingly, controller 18 can easily and accurately determine whether or not switching element 15 operates normally.

If switching element 15 fails to operate due to, e.g. breakage thereof, controller 18 of in-vehicle power supply device 10 sends, to the outside of in-vehicle power supply device 10, a signal indicating that switching element 15 fails to operate. Controller 18 of in-vehicle power supply device 10 can require checking and repairing of switching element 15 to the outside of in-vehicle power supply device 10. In-vehicle power supply device 10 determines, by the following procedure, whether or not switching element 15 operates normally.

First, the checking of switching element performed by in-vehicle power supply device 10, door lock device 24 provided in door 9b, and the sleep mode of vehicle 9 and power supply circuit 16 of in-vehicle power supply device 10 will be described briefly below.

In-vehicle power supply device 10 checks the state of switching element 15 after a passenger instructs door lock device 24 to release a lock of door 9b of vehicles 9 while control switch 22 functioning as a vehicle-starting switch is turned off. For instance, when vehicle 9 is left and stops its function, the state of switching element 15 is checked after remote controller 25 instructs door lock device 24 to release the lock.

When vehicle 9 is turned into the left state from a startup state previously, all of control switches 22 including an engine switch or an accessory switch are turned off. When control switch 22 is turned off and vehicle 9 is left, vehicle 9 or in-vehicle power supply device 10 rarely consumes a large current. After a predetermined time, such as 10 minutes, 30 minutes, 1 hour, or 2 hours, elapses from the time when control switch 22 functioning as a vehicle-starting switch is turned off, vehicle 9 or controller 18 of in-vehicle power supply device 10 is turned into a sleep state as to reduce current consumption in not only load 19 but also in a control system.

In the sleep state, a frequency of a clock signal of controller 18 is, for example, lower than the case where vehicle 9 operates normally. Thus, controller 18 may consume a small current when vehicle 9 is left.

In this situation, if a passenger instructs door lock device 24 of vehicle 9 to release the lock, power source start signal S18 is sent to controller 18 from door lock device 24 or a control facility for controlling the entire of vehicle 9. As mentioned above, power supply circuit 16 of in-vehicle power supply device 10 has first determining operation M111, second determining operation M112, and third determining operation M113 which are performed by controller 18. FIG. 3A and FIG. 3B illustrate output voltage Vo in first determining operation M111, second determining operation M112, and third determining operation M113. Controller 18 instructs switching element 15 to open and close switching element 15 and instructs boost convertor 13 to perform the boost-up operation. Further, controller 18 performs detection of a voltage, calculation based on the detected value, and storage of the calculated result data. Furthermore, controller 18 checks the state of switching element 15 based on these data.

In FIG. 3A and FIG. 3B, vehicle 9 is left before time point t0. Then, a passenger instructs, from remote controller 25 of vehicle 9, door lock device 24 to release a lock at time point t0. When door lock device 24 is turned from a locked state to a lock released state, or when remote controller 25 instructs door lock device 24 to release the lock, power source start signal S18 is sent to controller 18 from vehicle 9 through start-signal receiving section 18s. Until first determining operation M111 is started, vehicle 9 is left during a period from time point t0 to time point t1. Therefore, power consumption in load 19 is very small.

First determining operation M111 is started at time point t1, and subsequently second determining operation M112 and third determining operation M113 are performed.

Door lock device 24 is provided in door 9b. However, door lock device 24 is not necessarily provided in door 9b, but may be attached to a trunk of vehicle 9.

When determining that switching element 15 is in an abnormal state in third determining operation M113, controller 18 may store the determination result in third determining operation M113. After the determination result is stored, when control switch 22 is switched to restart vehicle 9, controller 18 may be configured to send an alarm signal to warning device 23. At this moment, control switch 22 may be a vehicle-starting switch for starting vehicle 9.

As mentioned above, controller 18 performs first determining operation M111 in response to start signal S18 received while power supply circuit 16 is in the sleep state.

Further, controller 18 performs first determining operation M111 to third determining operation M113 in each of plural driving cycles each corresponding to a period from the time when vehicle 9 started to the time when vehicle 9 stops. In this case, when determining that switching element 15 is in an abnormal state in each of the driving cycles, controller 18 may send an alarm signal to warning device 23.

In the above description, controller 18 determines an abnormality in which switching element 15 fails to be switched from an open state to a closed state. On the other hand, if switching element 15 fails to be switched from the closed state to the open state, boost convertor 13 can hardly perform the boost-up operation at any time point. Therefore, when the voltage of output terminal 17 does not increase to voltage V1 or predetermined determination value although controller 18 instructs boost convertor 13 to perform the boost-up operation, controller 18 may determine that switching element 15 remains in the closed state, i.e., is in an abnormal state.

In, e.g. first determining operation M111, controller 18 may determine whether boost convertor 13 performs the boost-up operation normally or not.

In this case, controller 18 detects voltage Vt1 at output terminal 17 in boost-up period P101. Then, controller 18 compares voltage Vt1 with determination value Vth102 as a boost-up determination value, and determines whether the boost-up operation of boost convertor 13 is normal or not. When voltage Vt1 is equal to or higher than determination value Vth102, controller 18 determines that boost convertor 13 performs the boost-up operation normally.

When voltage Vt1 is lower than determination value Vth102, controller 18 determines that boost convertor 13 is in an abnormal state. Then, controller 18 sends the determination result to warning device 23 in vehicle 9 as an alarm signal. The determination result indicates that boost convertor 13 or power supply circuit 16 is in an abnormal state. Warning device 23 is provided outside in-vehicle power supply device 10. Alternatively, controller 18 may store the determination result indicating whether boost convertor 13 is in normal state or not.

Thus, controller 18 can determine whether a value of the voltage discharged from smoothing capacitor 13d at the time point t2 is normal or not while determining whether the boost-up operation of boost convertor 13 is normal or not. For this reason, controller 18 can stably compare output voltage Vo at time point t4 with determination value Vth101 in third determining operation M113 and perform determination accurately on the comparison result.

Controller 18 can detect voltage Vt1 of output terminal 17 at any time point during a period from time point t1 to time point t2. However, if detecting voltage Vt1 at time point t2, controller 18 can determine more accurately whether the value of the voltage discharged from smoothing capacitor 13d at time point t2, mentioned before, is normal or not. Therefore, controller 18 can stably and accurately perform the determination based on output voltage Vo at time point t4.

Exemplary Embodiment 2

Figure 4:
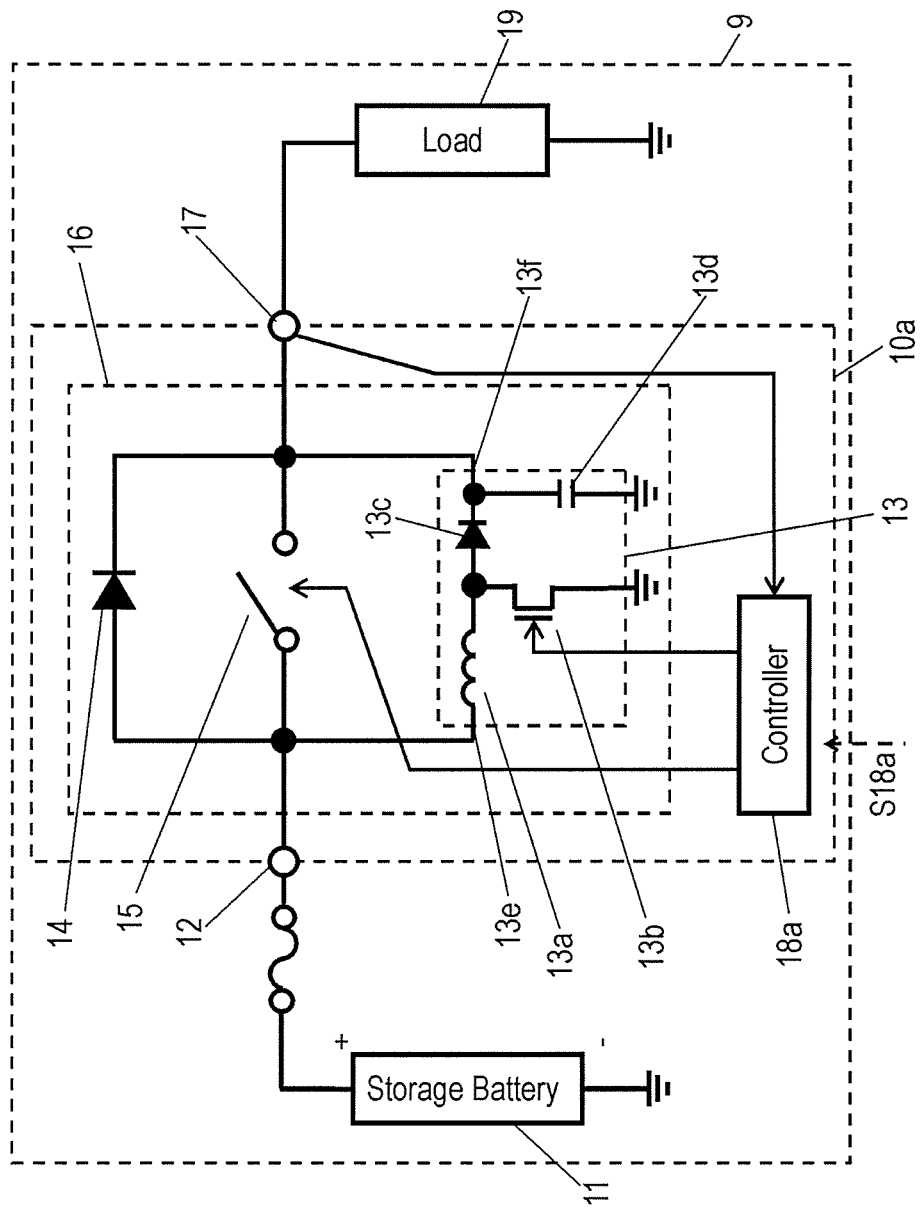
FIG. 4 is a circuit block diagram of an in-vehicle power supply device in accordance with Exemplary Embodiment 2.

In FIG. 4, components identical to those of in-vehicle power supply device 10 according to Embodiment 1 shown in FIG. 1 are denoted by the same reference numerals. In-vehicle power supply device 10a is installed to vehicle 9 shown in FIG. 2 like in-vehicle power supply device 10 according to Embodiment 1. In-vehicle power supply device 10a includes controller 18a for detecting output voltage Vo at output terminal 17 and controlling boost convertor 13 and switching element 15, instead of controller 18 of in-vehicle power supply device 10 according to Embodiment 1.

FIGS. 5A to 5C illustrate output voltage Vo of in-vehicle power supply device 10a. In FIGS. 5A to 5C, a vertical axis represents output voltage Vo, and a horizontal axis represents time. Power supply circuit 16 has first determination mode M1 and second determination mode M2 which are performed by controller 18a. In first determination mode M1, controller 18a checks a state of load 19 at output terminal 17. In second determination mode M2 which is performed after first determination mode M1, controller 18a checks a state of switching element 15 based on the checked result in first determination mode M1.

In the above configuration and operation, controller 18a firstly checks the state of load 19 in first determination mode M1 before determining whether switching element 15 is in a normal state or in an abnormal state in second determination mode M2. After that, controller 18a checks the state of switching element 15 in second determination mode M2.

That is, in order to determine whether or not it can determine whether or not the determination in second determination mode M2 is performed, controller 18a previously checks a state of an electric power supplied to load 19 connected to in-vehicle power supply device 10 in first determination mode M1 before performing second determination mode M2. Subsequently, controller 18a determines whether or not switching element 15 operates normally in second determination mode M2. Thus, the state of switching element 15 can stably and accurately be checked in second determination mode M2.

First determination mode M1 can be started in response to start signal S18a received by controller 18. As in Embodiment 1, when an instruction for releasing a door lock is sent from remote controller 25 or when operation switch 22 is switched, controller 18 receives starting signal S18a.

A configuration and operation of in-vehicle power supply device 10a and vehicle 9 including the device will be detailed below. Vehicle 9 having a stop-idling function includes vehicle body 9a, in-vehicle power supply device 10, storage battery 11, and load 19. In-vehicle power supply device 10a, storage battery 11, and load 19 are mounted to vehicle body 9a. Storage battery 11 and load 19 are connected to input terminal 12 and output terminal 17 of in-vehicle power supply device 10a, respectively. When starter 20a restarts engine 20 from a stop-idling state while vehicle 9 stops for waiting for, e.g. a traffic light, in-vehicle power supply device 10a performs a basic operation as follows. For instance, if a driver changes operation conditions of brake pedal 21 in the stop-idling state, in-vehicle power supply device 10a receives a signal for starting in-vehicle power supply device 10a. When in-vehicle power supply device 10a is started and causes boost convertor 13 to perform the boost-up operation, starter 20a rotates to restart engine 20. At this moment, a voltage necessary for load 19 is supplied. As a result, load 19 can stably operate continuously. Vehicle 9 further includes door 9b attached to vehicle body 9a, and door lock device 24 provided in door 9b. Door lock device 24 locks door 9b and unlocks door 9b, i.e., can release a lock of door 9b.

In power supply circuit 16 of in-vehicle power supply device 10a, when engine 20 is in a stop-idling state while vehicle 9 stops for waiting for, e.g. a traffic light, controller 18a causes switching element 15 to be closed and prohibits boost convertor 13 from operating. In this situation, storage battery 11 supplies electric power to load 19 through input terminal 12 and switching element 15.

On the other hand, when engine 20 is turned into a restart state from the stop-idling state, controller 18a opens switching element 15 and starts operating boost convertor 13. In this situation, boost convertor 13 supplies electric power to load 19 during a predetermined period of time.

When engine 20 is turned into a continuous operation state, boost convertor 13 terminates the above operation during the predetermined period and finishes the supply of electric power to load 19, and then switching element 15 is closed. Thus, storage battery 11 supplies electric power to load 19 through input terminal 12 and switching element 15.

While engine 20 continuously operates, the above situation basically continues. Boost convertor 13 includes boosting coil 13a, field-effect transistor (FET) 13b, rectifier diode 13c, and smoothing capacitor 13d. Smoothing capacitor 13d is connected closest to output terminal 17 of boost convertor 13, i.e., output port 13f.

Even if switching element 15 of power supply circuit 16 fails to operate due to, e.g. breakage thereof, connection-assist diode 14 connected in parallel to switching element 15 can supply electric power to load 19 from storage battery 11 continuously although in-vehicle power supply device 10a may not start boost convertor 13. An anode of connection-assist diode 14 is connected to input terminal 12 of in-vehicle power supply device 10a while a cathode thereof is connected to output terminal 17 of in-vehicle power supply device 10a.

If switching element 15 fails to operates due to, e.g. breakage thereof, controller 18a of in-vehicle power supply device 10a sends, to the outside of in-vehicle power supply device 10a, a signal indicating that switching element 15 fails to operate. In-vehicle power supply device 10a requires checking and repairing of switching element 15 for the outside of in-vehicle power supply device 10a. Controller 18a of in-vehicle power supply device 10a determines, by the following procedure, whether or not switching element 15 can operate normally.

Controller 18a of in-vehicle power supply device 10a may check the state of switching element 15 in various situations of vehicle 9. In accordance with Embodiment 2, controller 18a checks the state of switching element 15 after the driver switches operation switch 22 functioning as a vehicle-starting switch of vehicle 9 from turning on of switching element 15 to turning off of switching element 15. This operation will be described below. Operation switch 22 may be an accessory switch or an engine switch mounted to vehicle 9. In other words, when operation switch 22 is switched, controller 18a performs first determination mode M1 in response to start signal S18a received by controller 18.

As shown in FIGS. 5A to 5C, power supply circuit 16 of in-vehicle power supply device 10a has first determination mode M1 and second determination mode M2 which are performed by controller 18a. Controller 18a performs first determination mode M1 in response to the switching of operation switch 22 from turning on of operation switch 22 to turning off of operation switch 22. In FIGS. 5A to 5C, operation switch 22 is switched from turning on of operation switch 22 to turning off of operation switch 22 at time point t0. Controller 18a instructs switching element 15 to open and close switching element 15. Further, controller 18a performs detection of voltage, calculation based on a value of the detected voltage, and storage of the calculation result data. Furthermore, controller 18a checks the state of switching element 15 based on these data. When determining that switching element 15 is in an abnormal state, controller 18a may send an alarm signal to a warning device.

Firstly, in first determination mode M1, controller 18a checks the state of load 19 at output terminal 17. That is, controller 18a detects a value of output voltage Vo at output terminal 17 in first determination mode M1. First determination mode M1 has first determining operation M11 and second determining operation M12. That is, in first determination mode M1, power supply circuit 16 and controller 18a perform first determining operation M11 and second determining operation M12.

At first, in first determining operation M11, controller 18a instructs switching element 15 to open switching element 15. Further, controller 18a instructs boost convertor 13 to perform a boost-up operation in which boost convertor 13 boosts input voltage Vi during period P1 starting from time point t1. Input voltage Vi is a voltage of storage battery 11 input to input terminal 12. In the operation shown in FIG. 3A, a predetermined initial standby period Hp is provided between time point t0 and time point t1, but the initial standby period Hp may be zero, that is, time point t0 may be identical to time point t1. For instance, boost convertor 13 boosts input voltage Vi of 12V at input terminal 12 which is an output voltage of storage battery 11 to predetermined voltage V1 of 14.5V for boost-up period P1. This boost-up operation may be the same as the boost-up operation performed when engine 20 is switched from a stop-idling state to a restarting state while operation switch 22 functioning as a vehicle-starting switch is turned on. According to the present embodiment, the voltage (input voltage Vi) of storage battery 11 is 12V while voltage V1 for boost-up period P1 is 14.5V, but not limited to these voltage values when in-vehicle power supply device 10 operates.

Alternatively, during boost-up period P1 in first determining operation M11, input voltage Vi of 12V is boosted to voltage V1 of 14.5. On the other hand, while operation switch 22 is turned on, i.e., while vehicle 9 operates normally, when engine 20 is switched from the stop-idling state to the restarting state, the boost-up operation maintains input voltage Vi of 12V and output it from output terminal 17 as output voltage Vo. Thus, in the boost-up operation, output voltage Vo boosted from input voltage Vi may be changed to different values depending on situations.

Next, in second determining operation M12, controller 18a causes boost convertor 13 to stop the boost-up operation at time point t2 when boost-up period P1 elapses. At this moment, controller 18a instructs switching element 15 to continuously open switching element 15. Further, controller 18 detects voltage Vt3 at output terminal 17 at time point t3 when predetermined period P11 elapses from time point t3 when boost convertor 13 stops the boost-up operation. During predetermined period P11 form time point t2 to time point t3, any of voltage discharged from smoothing capacitor 13d or voltage of the storage battery 11 through connection-assist diode 14 whichever is higher is output from output terminal 17.

Performing the above operation, controller 18a checks a power consumption state of current Io flowing through output terminal 17, i.e., current Io in load 19. A discharge voltage from smoothing capacitor 13d and a voltage of storage battery 11 through connection-assist diode 14 are supplied to output terminal 17. At this moment, switching element 15 opens and boost convertor 13 stops the boost-up operation at time point t2. Thus, voltage Vo at output terminal 17 decreases with time elapsing from time point t2 to time point t3. The speed of decrease changes depending on the state of load 19. For instance, if load 19 consumes a large current, output voltage Vo decreases rapidly, as shown in FIG. 3C. Accordingly, at time point t3 when predetermined period P11 elapses after boost convertor 13 stops the boost-up operation, voltage Vt3 detected at output terminal 17 is low.

Voltage Vt3 detected at output terminal 17 is compared with determination value Vth1 by controller 18a. As shown in FIGS. 5A and 5B, when voltage Vt3 of output voltage Vo at time point t3 is equal to or higher than determination value Vth, controller 18a performs second determination mode M2 after first determination mode M1.

Next, in second determination mode M2, controller 18a checks the state of switching element 15 by detecting a value of output voltage Vo at output terminal 17. However, the detection of output voltage Vo at output terminal 17 by controller 18a is different from first determining operation M11 and second determining operation M12 of first determination mode M1, described above. Second determination mode M2 includes third determining operation M21, fourth determining operation M22, and fifth determining operation M23. Power supply circuit 16 and controller 18 operate according to third determining operation M21, fourth determining operation M22, and fifth determining operation M23.

When controller 18a determines that voltage Vt3 of output voltage Vo at time point t3 is equal to or higher than determination value Vth in the second determining operation M12 of first determination mode M1, controller 18a performs third determining operation M21, fourth determining operation M22, and fifth determining operation M23 in second determination mode M2.

In third determining operation M21, controller 18a instructs switching element 15 at time point t3 to continuously open switching element 15. Then, controller 18a instructs boost convertor 13 again at time point t3 to perform the boost-up operation in which boost convertor 13 boosts the voltage of storage battery 11 to voltage V1. Third determining operation M21 is performed at time point t3 succeeding to second determining operation M12. Even here, like the boost-up operation in first determining operation M11, the output voltage of storage battery 11 which is applied to input terminal 12 as input voltage Vi is boosted to voltage V1 in boost-up period P2. Boost-up period P2 of third determining operation M21 may be the same in length as boost-up period P1 of first determining operation M11, or may be different in length form boost-up period P1 of first determining operation M11. As shown in FIGS. 5A to 5C, in boost-up period P2, the boost-up operation from voltage Vt3 to voltage V1 is apparently performed, but boost convertor 13 of power supply circuit 16 performs a boost-up operation from input voltage Vi to voltage Vi.

Next, in fourth determining operation M22, controller 18a causes boost convertor 13 to stop the boost-up operation at time point t4 when boost-up period P2 elapses from time point t3. Further, at time point t5 when predetermined period P21 elapses from time point t4 when boost convertor 13 is stopped, controller 18a instructs switching element 15 to be switched from the open state to the closed state. Subsequently, in fifth determining operation M23, after third predetermined period P22 elapses from time point t5 when controller 18a instructs switching element 15 to be switched from the open state to the closed state, controller 18a detects voltage Vt6 which is output voltage Vo at output terminal 17 at time point t6. Controller 18a compares voltage Vt6 with determination value Vth2 to check the state of switching element 15 based on the comparison result.

During period P21 from time point t4 to time point t5 in which fourth determining operation M22 is performed, any of discharge voltage from smoothing capacitor 13d or voltage Vi of storage battery 11 through connection-assist diode 14 whichever is higher is supplied to output terminal 17. In period P21, switching element 15 is in the open state and boost convertor 13 stops at time point t4. Thus, voltage Vo of output terminal 17 decreases with time elapsing from time point t4 to time point t5.

After that, controller 18a instructs switching element 15 at time point t5 to be switched from the open state to the closed state.

In the case that switching element 15 in the open state functions normally in response to an instruction from controller 18a, when switching element 15 is closed, voltage Vo at output terminal 17 changes drastically at time point t5, as shown in FIG. 3B. That is, output voltage Vo of output terminal 17 rapidly decreases to a value substantially identical to input voltage Vi at time point t5 since output port 13f of boost convertor 13 is connected to input terminal 12 connected to storage battery 11 which has a lower voltage. Therefore, voltage Vt6 of output voltage Vo at time point t6 is lower than determination value Vth2. Accordingly, when voltage Vo at output terminal 17 is lower than determination value Vth2, which serves as a determination value, at time point t6 in fifth determining operation M23, controller 18a determines that switching element 15 is in a normal state. On the other hand, when switching element 15 is continuously in the open state until time point t5 in the case that switching element 15 fails to operate in response to an instruction from controller 18a, i.e., is in an abnormal state, voltage Vo of output terminal 17 decreases gradually as shown in FIG. 5A while switching element 15 is continuously in the open state. That is, like period P11 from time point t2 to time point t3 in second determining operation M12, any of discharge voltage from smoothing capacitor 13d or voltage Vi of storage battery 11 through connection-assist diode 14 whichever is higher is also continuously supplied to output terminal 17 after time point t5. Thus, voltage Vt6 at output terminal 17 becomes equal to or higher than determination value Vth2. Accordingly, when voltage Vo of output terminal 17 is equal to or higher than determination value Vth2 at time point t6 in fifth determining operation M23, controller 18a determines that switching element 15 is in an abnormal state. Strictly speaking, when voltage Vo of output terminal 17 is equal to or higher than determination value Vth2 at time point t6, controller 18a determines that switching element 15 is in the open state, which means that switching element 15 fails to operate in response to an instruction for closing switching element 15 to be in the closed state.

As shown in FIG. 5C, when voltage Vt3 is lower than determination value Vth1, controller 18a terminates the check of switching element 15 in first determination mode M1 without performing second determination mode M2. Then, controller 18a determines that the state of switching element 15 cannot be checked.

As shown in FIG. 5C, when voltage Vt3 is lower than determination value Vth1, load 19 consuming a large current is connected to output terminal 17. That is because, even if switching element 15 operates normally, i.e., can be opened and closed in response to an instruction from controller 18a, or even if switching element 15 is in an open state after time point t2, output voltage Vo at output terminal 17 at time point t6, i.e., voltage Vt6 may be lower than determination value Vth2 due to abnormality of switching element 15.

Therefore, in this situation, if being performed after first determination mode M1, second determination mode M2 may fail to compare voltage Vo of output terminal 17 with determination value Vth2 correctly. Consequently, when voltage Vt3 is lower than determination value Vth1 in the first determination mode M1, as shown in FIG. 5C, controller 18a terminates the check of switching element 15 in first determination mode M1 without performing second determination mode M2, and determines that the state of switching element 15 cannot be checked. For instance, after operation switch 22 is switched from turning on of operation switch 22 to turning off of operation switch 22, a driver stays in vehicle 9 and continuously uses an accessory, such as a car audio, which is a part of loads 19. In this case, the state of switching element 15 cannot be checked since current Io, a consumed current, flowing through load 19 is large.

Figure 8:
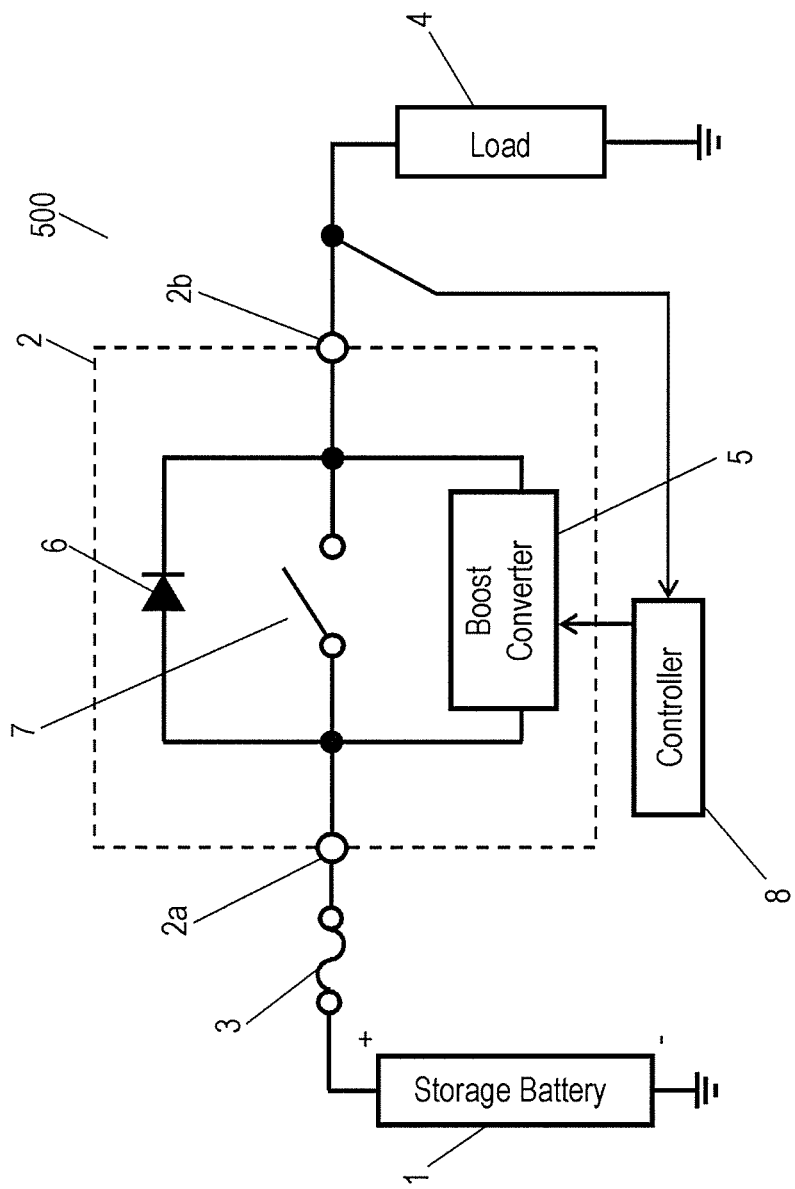
FIG. 8 is a circuit block diagram of a conventional in-vehicle power supply device.

In conventional in-vehicle power supply device 500 shown in FIG. 8, there is little difference in a voltage value at output terminal 2b between the case where electric power from storage battery 1 is supplied to output terminal 2b through switch 7 and the case where electric power from storage battery 1 is supplied to output terminal 2b through connection-assist diode 6.

Thus, abnormalities of switch 7 may not be checked stably and accurately based on the comparison between these voltage values.

In in-vehicle power supply device 10a according to Embodiment 2, as mentioned above, before controller 18a determines whether switching element 15 is in a normal state or in an abnormal state, first determination mode M1 determines whether or not the state of switching element 15 can be checked in second determination mode M2. After that, second determination mode M2 determines whether or not switching element 15 operates normally. In the determination of second determination mode M2, determination value Vth2 tends to be much different from voltage Vo at output terminal 17 regardless of switching element 15 in a normal state or in an abnormal state. As a result, controller 18a can stably check the state of switching element 15 accurately.

In order to check the state of switching element 15 more stably, when controller 18a determines that input voltage Vi from storage battery 11 at input terminal 12 is out of a predetermined range from a predetermined lower limit value to a predetermined upper limit value higher than the lower limit value, controller 18a performs neither first determination mode M1 nor second determination mode M2. For instance, when input voltage Vi is higher than the upper limit value, a voltage drop after time point t4 is small even when switching element 15 is continuously in the open state. Alternatively, the voltage drop after switching element 15 is closed at time point t5 is small. This may prevent the determination from being performed based on the comparison between determination value Vth2 and output voltage Vt6 shown in FIG. 5A. Further, when input voltage Vi is lower than the lower limit value, boost convertor 13 may be prevented from boosting input voltage Vi to voltage V1 which is a voltage obtained by the boost-up operation. Therefore, input voltage Vi from storage battery 11 at input terminal 12 may be preferably within the predetermined range.

As described above, the determination is progressed from first determination mode M1 to second determination mode M2, and is finalized when second determination mode M2 determines that switching element 15 is in an abnormal state. Then, the finalized determination result is sent to warning device 23, which is provided outside in-vehicle power supply device 10a, in vehicle 9 from controller 18a of in-vehicle power supply device 10a. The determination performed in each of first determination mode M1 and second determination mode M2 is not limited to one time. Each determination may be repeated at several times.

Further, at the next starting time of vehicle 9, i.e., when control switch 22 is switched from turning off to turning on, controller 18a may send the determination result to warning device 23, which is provided outside in-vehicle power supply device 10a, in vehicle 9. That is, controller 18a stores the determination result until any determination with respect to switching element 15 is performed. When control switch 22 is switched from turning off to turning on at the next starting time of vehicle 9, controller 18a detects the starting of vehicle 9, and then sends the determination result to warning device 23. Control switch may be a vehicle-starting switch.

When power supply circuit 16 is in a sleep state, first determination mode M1 may be performed in response to start signal S18a received by controller 18a, similarly to Embodiment 1.

Similarly to Embodiment 1, when door lock device 24 is switched from a lock state to a lock release state, or when remote controller 25 instructs door lock device 24 to release the lock, power source start signal S18a is sent to controller 18a. After that, first determination mode M1 may be performed.

Figure 6:
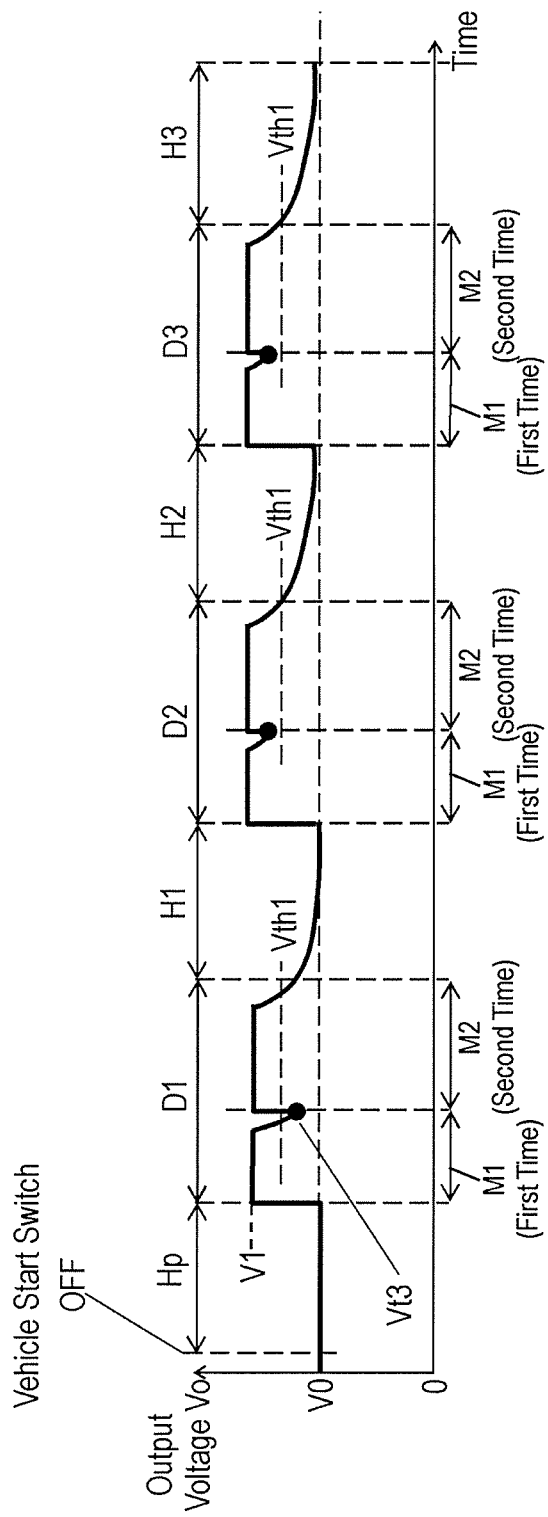
FIG. 6 shows the output voltage of the in-vehicle power supply device in accordance with Embodiment 2.

FIG. 6 illustrates output voltage Vo when in-vehicle power supply device 10a according to Embodiment 2 operates. In FIG. 6, a vertical axis represents output voltage Vo, and a horizontal axis represents time. As shown in FIG. 6, a predetermined standby period is provided after control switch 22 is turned off. In addition to this, determination periods D1, D2, and D3 each including first determination mode M1 and second determination mode M2 may be performed repetitively.

For instance, first determination period D1 is started by an instruction from controller 18a. In first determination mode M1 at the first time of determination period D1 at the first time, voltage Vt3 is lower than determination value Vth1 since load 19 consuming a large current is connected to in-vehicle power supply device 10a. Thus, controller 18a determines that switching element 15 cannot be checked. However, at this moment, controller 18a performs second determination mode M2 without terminating first determination period D1. Then, regardless of the result in second determination mode M2 at the first time, controller 18a stores that switching element 15 cannot be checked in first determination period D1. Then, after standby period H1 at the first time elapses, second determination period D2 is started.

In first determination mode M1 at the second time of second determination period D2, voltage Vt3 is higher than determination value Vth1 since load 19 consuming a large big current is not connected to in-vehicle power supply device 10a. Accordingly, controller 18a determines that switching element 15 can be checked. Then, controller 18a performs second determination mode M2 at the second time, and checks the state of switching element 15. According to the determination, controller 18a stores the determination result in second determination period D2. Then, after second standby period H2 elapses, third determination period D3 is started.

In FIG. 6, three determination periods D1 to D3 and three standby periods H1 to H3 are repeated alternately, but the number of determination periods and the number of standby periods may be determined appropriately.

The lengths of standby periods H1 to H3 are determined appropriately. As mentioned above, when it is determined that switching element 15 cannot be checked in first determination period D1 and switching element 15 can be checked in second determination period D2 and third determination period D3, controller 18a may determine that first determination period D1 is invalid and second determination period D2 is valid. Thus, controller 18a may check switching element 15 based on the determination result in second determination period D2 and third determination period D3.

Alternatively, based on results in plural determination periods, as mentioned above, when the number of times of determination that switching element 15 is in an abnormal state out of a predetermined number of times of determination which is stored in controller 18*a* is larger than a reference number, controller 18*a* may finally determine that switching element 15 is in the abnormal state. In this case, when the number of times of determination that switching element 15 is in an abnormal state out of the predetermined number of times of determination which is stored in controller 18*a* is smaller than or equal to the reference number, controller 18*a* may finally determine that switching element 15 is not in an abnormal state, i.e., is in a normal state. If switching element 15 is in the abnormal state, in-vehicle power supply device 10*a* may send an alarm signal to warning device 23 or a vehicle control functioning part which is provided in vehicle 9 for controlling the entire of vehicle 9.

Thus, even if determination failure occurs in first determination mode M1 in first determination period D1 when automobile electric devices are continuously used immediately after operation switch 22 is turned off, the state of switching element 15 can be checked correctly in following determination periods D2 and D3 since the determination periods are repetitively performed plural times.

Furthermore, even if a noise enters into controller 18*a* or boost convertor 13 from the outside in first determination period D1, an erroneous determination due to the noise is prevented unless the noise enters continuously since the determination periods are repetitively performed plural times, so that the state of switching element 15 can be finally checked correctly.

Controller 18*a* determines in first determination period D1 that switching element 15 can be checked in second determination mode M2 based on the determination result in first determination mode M1 at the first time. After that, second determination mode M2 at the first time is performed. However, when determining that switching element 15 cannot be checked in the first determination mode, controller 18*a* may store that it is determined in first determination period D1 that switching element 15 cannot be checked, and then, instruct power supply circuit 16 to operate in first standby period H1 without performing second determination mode M2. Controller 18*a* may operate with lower power consumption during standby periods H1, H2, and H3 than during determination periods D1, D2, and D3. That is, controller 18*a* may operate with low power consumption during standby periods H1, H2, and H3. As described above, in determination periods D1, D2, and D3, large electric power is necessary for controller 18*a* to control switching element 15 or FET 13*b*, detect voltage Vo at output terminal 17, and perform determination, calculation, and the like. On the other hand, during standby periods H1, H2, and H3, little electric power is necessary for controller 18*a* although time count and storage of calculated results are performed until each of the determination period consequent to respective one of the standby periods.

For the above reason, a clock frequency of a micro controller used for controller 18*a* during standby periods H1, H2, and H3 may be lower than during determination periods D1, D2, and D3. Thus, an operating frequency of the microcomputer decreases during standby periods H1, H2, and H3, thereby reducing electric power, i.e., reducing power consumption during standby periods H1, H2, and H3. Since each of standby periods H1, H2, and H3 is a long period ranging from about 5 minutes to 10 minutes while each of determination periods D1, D2, and D3 is a several seconds, the above configuration drastically reduces electric power consumed for operating the microcomputer.

In the above description, the determination periods and the standby periods are repeated from a time since when operation switch 22 of vehicle 9 is turned off. Plural determination periods D1, D2, and D3 may be repeated over plural driving cycles, or repeated every time when vehicle 9 is started by operation switch 22 plural times. FIGS. 7A and 7B illustrate output voltage Vo of in-vehicle power supply device 10 according to Embodiment 2 in operation. In FIGS. 7A and 7B, a vertical axis represents output voltage Vo, and a horizontal axis represents time. In the operation shown in FIGS. 7A and 7B, predetermined standby periods H1, H2, and H3 are provided, and determination periods D1, D2, and D3 each including first determination mode M1 and second determination mode M2 are repeated to obtain a present determination result. The present determination result may be combined with the previous determination result which is obtained when operation switch 22 is turned off. First, as described before, when operation switch 22 is turned off at individual timing, determination periods and standby periods are repeated. Controller 18*a* stores determination results in the respective determination periods. In addition to the present determination result which is obtained after operation switch 22 shown in FIG. 7B is turned off, the previous determination result which is obtained after operation switch 22 shown in FIG. 7A is turned off is used to check switching element 15. Based on the present and the previous determination results being obtained after operation switch 22 is turned off, the final determination described above is performed. When the final determination shows that switching element 15 is in an abnormal state, in-vehicle power supply device 10*a* may send an alarm signal to warning device 23 in vehicle 9.

That is, determinations are performed plural times in the determination periods. Additionally, the previous determination result obtained during the determination period when operation switch 22 is turned off is added to this result to check the state of switching element 15. Thus, even if determination failure occurs in first determination mode M1 when automobile electronic devices are continuously used during first determination period D1 immediately after operation switch 22 is turned off, the state of switching element 15 is checked correctly during determination periods D2 and D3 after determination period D1. Controller 18*a* further detects similar abnormalities in a different environment or a different state of storage battery 11, and determines that switching element 15 is in an abnormal state, thus providing a reliable determination result.

In the above description, controller 18*a* determines that switching element 15 is in an abnormal state while switching element 15 is in the open state. However, if controller 18*a* determines that switching element 15 is in an abnormal state while switching element 15 is in the closed state, boost convertor 13 cannot perform the boost-up operation anytime. Accordingly, when a voltage at output terminal 17 does not increase to voltage V2 higher than voltage V1 or does not increase to the predetermined determination value although controller 18*a* instructs boost convertor 13 to perform the boost-up operation, controller 18*a* may determine that switching element 15 is an abnormal state in which switching element 15 is continuously in the closed state.

According to the present embodiment, controller 18*a* is an independent single functional division of in-vehicle power supply device 10*a*. However, controller 18*a* may be included in some functional divisions of vehicle control function parts for controlling the entire of vehicle 9 and control in-vehicle power supply device 10a.

When in-vehicle power supply device 10a sends, to the outside of in-vehicle power supply device 10a, an alarm signal indicating that switching element 15 is in an abnormal state, the alarm signal may be sent to a functional part of the vehicle control function parts other than controller 18a for controlling the entire of vehicle 9.

For convenience of description, controller 18a and power supply circuit 16 are separated in in-vehicle power supply device 10a, but controller 18a may be integrated with power supply circuit 16.

As described above, controller 18a is configured to perform first determination mode M1 in which controller 18a determines a power consumption state of load 19, and to perform second determination mode M2 in which controller 18a determines a state of switching element 15 based on the determination result of first determination mode M1.

In first determination mode M1, controller 18a may be configured to perform first determining operation M11 and second determining operation M22. In second determination mode M2, controller 18a may be configured to perform third determining operation M21, fourth determining operation M22, and fifth determining operation M23. In first determining operation M11, the controller instructs switching element 15 to open switching element 15 and instructs boost convertor 13 to perform a first boost-up operation in which boost converter 13 boosts input voltage Vi at input terminal 12 to voltage V1 higher than input voltage Vi in first boost-up period P1. In second determining operation M12, controller 18a instructs boost convertor 13 to stop the first boost-up operation at time point t2 when first boost-up period P1 elapses and determines the power consumption state of load 19 based on voltage Vo detected at output terminal 17 at time point t3 when predetermined period P11 elapses from time point t2. In third determining operation M21, controller 18a instructs switching element 15 to continuously open switching element 15 and instructs boost convertor 13 to perform a second boost-up operation in which boost converter 13 boosts input voltage Vi to predetermined voltage V1 in second boost-period P2. In fourth determining operation M22, controller 18a instructs boost convertor 13 to stop the second boost-up operation at time point t4 when boost-up period P2 elapses, and instructs switching element 15 to close switching element 15 at time point t5 when predetermined period P21 elapses from time point t4. In fifth determining operation M23, controller 18a determines a state of switching element 15 based on voltage Vo detected at output terminal 17 after time point t5.

Controller 18a may be configured not to perform second determination mode M2 when controller 18a determines, in second determining operation M12, that voltage Vo detected at output terminal 17 is lower than predetermined determination value Vth1. Controller 18a may be configured to perform second determination mode M2 when controller 18a determines, in second determining operation M12, that voltage Vo detected at output terminal 17 is higher than or equal to predetermined determination value Vth1.

Controller 18a may be configured to determine that switching element 15 is in an abnormal state when controller 18a determines, in fifth determining operation M23, that voltage Vo detected at output terminal 17 is higher than or equal to predetermined determination value Vth2.

Controller 18a may be configured to determine that switching element 15 is in a normal state when controller 18a determines, in fifth determining operation M23, that voltage Vo detected at output terminal 17 is lower than predetermined determination value Vth2.

Controller 18a may be configured to perform first determination mode M1 and second determination mode M2 in plural determination periods D1, D2, and D3. In this case, controller 18a is configured to finally determine that switching element 15 is in an abnormal state when controller 18a determines that switching element 15 is in an abnormal state in second determination mode M2 more frequently in plural determination periods D1 to D3 than a predetermined number of times.

Standby periods H1, H2, and H3 may be provided between plural determination periods D1 to D3. Controller 18a may operate with lower electric power during standby periods H1, H2, and H3 than during plural determination periods D1 to D3.

Controller 18a may be configured to perform first determination mode M1 in which controller 18a determines a power consumption state of load 19 in response to switching of operation switch 22 or to releasing of door lock device 24. Controller 18a may be configured to perform second determination mode M2 in which controller 18a determines a state of switching element 22 based on the determination result of the first determination mode M1. Controller 18a may be configured to send an alarm signal to warning device 23 when controller 18a determines that switching element 15 is in an abnormal state in second determination mode M2.

Controller 18a may be configured to perform first determination mode M1 and second determination mode M2 in plural driving cycles each corresponding to a period from a time when vehicle 9 starts to a time when vehicle 9 stops. In this case, controller 18a may send the alarm signal to warning device 23 when controller 18a determines that switching element 15 is in an abnormal state in second determination mode M2 in each of the plural driving cycles.

In in-vehicle power supply device 10a, the state of switching element 15 is checked after the state of load 19 is detected. Therefore, the controller determines easily and correctly whether switching element 15 operates normally or not.

In the second determination mode M2 shown in FIGS. 5A and 5B, controller 18a may determine whether or not boost convertor 13 performs the boost-up operation normally.

Controller 18a detects voltage Vt2 at output terminal 17 in boost-up period P2. Controller 18a compares voltage Vt2 with predetermined determination value Vth102, which is a boost-up determination value, and determines whether boost convertor 13 operates the boost-up operation normally or not. When voltage Vt2 is equal to or higher than determination value Vth102, controller 18a determines that boost convertor 13 performs the boost-up operation normally.

When voltage Vt1 is lower than determination value Vth102, controller 18a determines that boost convertor 13 is in an abnormal state. Then, controller 18a sends, to warning device 23, which is provided outside in-vehicle power supply device 10a, in vehicle 9, the determination result as an alarm signal indicating that boost convertor 13 or power supply circuit 16 is in an abnormal state. Alternatively, controller 18a may store the alarm signal indicating whether boost convertor 13 is in a normal state or not.

Thus, controller 18a can determine whether a value of voltage discharged from smoothing capacitor 13d at time point t4 is correct or not while determining whether or not boost convertor 13 performs the boost-up operation normally. Therefore, controller 18a can compare output voltage Vo at time point t6 with determination value Vth2, and stably and accurately perform determination based on the comparison result.

Controller 18 may determine whether or not boost convertor 13 performs the boost-up operation normally during boost-up period P1 in first determination mode M1, instead of boost-up period P2 in second determination mode M2 shown in FIGS. 5A and 5B. Further, controller 18 may determine whether or not boost convertor 13 performs the boost-up operation normally during both of boost-up period P1 in first determination mode M1 and boost-up period P2 in second determination mode M2 shown in FIGS. 5A and 5B.

Controller 18 may detect voltage Vt1 at output terminal 17 anytime during a period from time point t3 to time point t4. However, if detecting voltage Vt1 at time point t4, controller 18a can accurately determine whether a value of the voltage discharged from smoothing capacitor 13d at time point t4 is correct or not. Accordingly, controller 18a can stably and accurately perform the determination at time point t6 based on output voltage Vo.

Further, as shown in FIGS. 5A and 5B, controller 18a detects voltage Vo at output terminal 17 between time point t0 and time point t1 to obtain voltage Vt0 as an initial voltage, and detects voltage Vo at time point t6 to obtain voltage Vt6 as a discharge voltage. Furthermore, controller 18a calculates and evaluates voltage difference Vdt6 between voltage Vt6 and voltage Vt0. The controller may determine whether or not voltage difference Vdt6 is larger than predetermined determination voltage difference Vdth as to check the state of switching element 15. That is, when potential difference Vdt6 is equal to or larger than determination voltage difference Vdth, controller 18a determines that switching element 15 is in an abnormal state, i.e., fails to operate in response to an instruction from controller 18a. When voltage difference Vdt6 is smaller than determination voltage difference Vdth, or when voltage difference Vdt6 is very small, controller 18a determines that switching element 15 is in a normal state, i.e., can be switched from the open state to the closed state in response to an instruction from controller 18a. In accordance with Embodiment 1 described above, a voltage difference between the initial voltage and the discharge voltage may be obtained to compare the voltage potential difference with the determination voltage difference, as mentioned above. Based on the compared result, controller 18 may determine whether switching element 15 is in a normal state or in an abnormal state.

In the above determination process, controller 18a can additionally determine whether or not boost convertor 13 operates normally.

Accordingly, a state of the entire of power supply circuit 16 including not only switching element 15 but also boost convertor 13 can be checked for a short time easily without adding a circuit or an operation.

As mentioned above, in first determining operation M11 and second determining operation M21 which are performed during a period from time point t1 to time point t2, when controller 18a instructs boost convertor 13 to perform the boost-up operation, a target value obtained by the boost-up operation is voltage V1. Further, when engine 20 is restarted from the stop-idling state, the target voltage value boosted by boost convertor 13 is a restarting voltage. Voltage V1 may be higher than the restarting voltage. Besides, the restarting voltage may change depending on the state of load 19 at the stop-idling time. Therefore, a difference between voltage Vt0 at time point t0 and the restarting voltage may be small. Accordingly, voltage V1 and determination value Vth2 serving as a determination value are preferably higher than voltage Vt0 and the restarting voltage. This configuration allows controller 18a to accurately determine whether or not boost convertor 13 operates normally in first determining operation M11 or second determining operation M21.

When detecting that input voltage Vi from storage battery 11 at input terminal 12 is out of a predetermined range from a lower limit value to an upper limit value higher than the lower limit value, controller 18a instructs to perform neither first determination mode M1 nor second determination mode M2 in order to check the state of switching element 15 stably. For instance, when input voltage Vi is higher than the upper limit value, a voltage drop width after time point t4 is small even if switching element 15 is continuously in the open state. Alternatively, after switching element 15 is closed at time point t5, the voltage drop width is small. Accordingly, determination value Vth2 shown in FIG. 5A is close to output voltage Vt6, and thus, the controller may not be able to perform the determination based on the comparison result. When input voltage Vi is lower than the lower limit value, boost convertor 13 may be prevented from boosting input voltage Vi to voltage V1, serving as the target voltage obtained by the boost-up operation. Therefore, input voltage Vi from storage battery 11 at input terminal 12 is preferably within the predetermined range.

INDUSTRIAL APPLICABILITY

An in-vehicle power supply device according to the present invention can easily check an operation of a power supply circuit for a short time, and is useful in various vehicles.

REFERENCE MARKS IN THE DRAWINGS 9 vehicle
9a vehicle body
9b door
10, 10a in-vehicle power supply device
11 storage battery
12 input terminal
13 boost convertor
14 connection-assist diode
15 switching element
16 power supply circuit
17 output terminal
18, 18a controller
18s start-signal receiving section
19 load
20 engine
21 brake pedal
22 operation switch
23 warning device
24 door lock device
25 remote controller

The invention claimed is:

1. An in-vehicle power supply device comprising:
an input terminal;
an output terminal configured to be connected a load;
a power supply circuit including
a boost convertor connected to the input terminal and the output terminal, the boost convertor being configured to perform a boost-up operation in which the boost convertor boosts a voltage supplied from the input terminal and outputs the boosted voltage from the output terminal, a connection-assist diode connected to the input terminal and the output terminal, and in parallel to the boost convertor, and a switching element connected to the input terminal and the output terminal, and in parallel to the boost convertor and the connection-assist diode; and a controller configured to detect a voltage at the output terminal and control the boost convertor and the switching element, wherein the controller is configured to:

perform a first determination mode in which the controller determines a power in consumption state of the load; and perform a second determination mode in which the controller determines a state of the switching element based on a determination result of the first determination mode.

2. The in-vehicle power supply device according to claim 1, wherein, in the first determination mode, the controller is configured to:

perform a first determining operation in which the controller instructs the switching element to open the switching element and instructs the boost convertor to perfolin a first boost-up operation in which the boost converter boosts an input voltage at the input terminal to a predetermined voltage higher than the input voltage in a first boost-up period; and perform a second determining operation in which the controller instructs the boost convertor to stop the first boost-up operation at a first time point when the first boost-up period elapses and determines the power consumption state of the load based on the voltage detected at the output terminal at a second time point when a first predetermined period elapses from the first time point, and wherein, in the second determination mode, the controller is configured to:

perform a third determining operation in which the controller instructs the switching element to continuously open the switching element and instructs the boost convertor to perform a second boost-up operation in which the boost converter boosts the input voltage to the predetermined voltage in a second boost-period;

perform a fourth determining operation in which the controller instructs the boost convertor to stop the second boost-up operation at a third time point when the second boost-up period elapses, and instructs the switching element to close the switching element at a fourth time point when a second predetermined period elapses from the third time point; and perform a fifth determining operation in which the controller detelinines a state of the switching element based on the voltage detected at the output terminal after the fourth time point.

3. The in-vehicle power supply device according to claim 2, wherein the controller is configured to:

not perform the second determination mode when the controller determines, in the second determining operation, that the voltage detected at the output terminal is lower than a predetermined determination value; and perform the second determination mode when the controller determines, in the second determining operation, that the voltage detected at the output terminal is higher than or equal to the predetermined determination value.

4. The in-vehicle power supply device according to claim 2, wherein the controller is configured to:

determine that the switching element is in an abnormal state when the controller determines, in the fifth determining operation, that the voltage detected at the output terminal is higher than or equal to a predetermined determination value; and determine that the switching element is in a normal state when the controller determines, in the fifth determining operation, that the voltage detected at the output terminal is lower than the predetermined determination value.

5. The in-vehicle power supply device according to claim 2, wherein the controller is configured to perform a boost-up determining operation in which the controller determines a state of the boost convertor based on the voltage detected at the output terminal in the first boost-up period or the second boost-up period.

6. The in-vehicle power supply device according to claim 1, wherein the controller is configured to:

perform the first determination mode and the second mode in a plurality of determination periods; and finally determine that the switching element is in an abnormal state when the controller determines that the switching element is in an abnormal state in the second determination mode more frequently in the plurality of determination periods than a predetermined number of times.

7. The in-vehicle power supply device according to claim 6, wherein a standby period is provided between the plurality of determination periods, and wherein the controller operates with lower electric power during the standby period than during the plurality of determination periods.

8. The in-vehicle power supply device according to claim 1, wherein the controller is configured to perform the first determination mode in response to a start signal which is received.

9. The in-vehicle power supply device according to claim 1, wherein the power supply circuit has a sleep state in which the power supply circuit does not operate, and wherein the controller is configured to perform the first determination mode in response to a start signal which is received while the power supply circuit is in the sleep state.

10. A vehicle comprising:

a vehicle body;

a storage battery installed to the vehicle body;

an operation switch installed to the vehicle body;

a warning device installed to the vehicle body;

a load installed to the vehicle body; and an in-vehicle power supply device including:

an input terminal connected to the storage battery;

an output terminal connected to the load;

a power supply circuit including a boost convertor connected to the input terminal and the output terminal and configured to perform a boost-up operation in which the boost converter boosts a voltage supplied from the input terminal and output the boosted voltage from the output terminal, a connection-assist diode connected to the input terminal and the output terminal, and in parallel to the boost convertor; and a switching element connected to the input terminal and the output terminal, and in parallel to the boost convertor and the connection-assist diode; and a controller configured to detect a voltage at the output terminal and control the boost convertor and the switching element, wherein the controller is configured to:
- perform a first determination mode in which the controller determines a power consumption state of the load in response to switching of the operation switch;
- perform a second determination mode in which the controller determines a state of the switching element based on a determination result of the first determination mode; and
- send an alarm signal to the warning device when the controller determines that the switching element is in an abnormal state in the second determination mode.

11. The vehicles according to claim 10,
wherein the controller is configured to perform the first determination mode and the second determination mode in a plurality of driving cycles each corresponding to a period from a time when the vehicle starts to a time when the vehicle stops, and
wherein the controller sends the alarm signal to the warning device when the controller determines that the switching element is in an abnormal state in the second determination mode in each of the plurality of driving cycles.

12. The vehicles according to claim 10, further comprising:
- a door installed to the vehicle body; and
- a door lock device installed to the door, wherein the controller is configured to perform the first determination mode in response to detecting that the operation switch is turned off and the door lock device is switched to a release of lock of the door.

13. The vehicles according to claim 12,
wherein the controller is configured to perform the first determination mode and the second determination mode in a plurality of driving cycles each corresponding to a period from a time when the vehicle starts to a time when the vehicle stops, and
wherein the controller sends the alarm signal to the warning device when the controller determines that the switching element is in an abnormal state in the second determination mode in each of the plurality of driving cycles.

* * * * *